(12) United States Patent
Mori et al.

(10) Patent No.: US 8,004,074 B2
(45) Date of Patent: Aug. 23, 2011

(54) SEMICONDUCTOR DEVICE AND FABRICATION METHOD

(75) Inventors: Kentaro Mori, Tokyo (JP); Katsumi Kikuchi, Tokyo (JP); Shintaro Yamamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 79 days.

(21) Appl. No.: 12/102,414

(22) Filed: Apr. 14, 2008

(65) Prior Publication Data

US 2008/0284001 A1    Nov. 20, 2008

(30) Foreign Application Priority Data

Apr. 13, 2007   (JP) ................................. 2007-105852

(51) Int. Cl.
   *H01L 23/02* (2006.01)
(52) U.S. Cl. ............ 257/686; 257/777; 257/E23.101
(58) Field of Classification Search .............. 257/686, 257/777, 712, 737
See application file for complete search history.

(56) References Cited

U.S. PATENT DOCUMENTS

| 6,384,315 B1 * | 5/2002 | Yamagishi et al. ........... 136/251 |
| 6,759,738 B1 * | 7/2004 | Fallon et al. ................. 257/690 |
| 2005/0009243 A1 | 1/2005 | Taniguchi |
| 2007/0045867 A1 * | 3/2007 | Machida ....................... 257/778 |

FOREIGN PATENT DOCUMENTS

| JP | 8-8354 | 1/1996 |
| JP | 2001-250863 | 9/2001 |
| JP | 2002-141444 | 5/2002 |
| JP | 2002-170906 | 6/2002 |
| JP | 2003-133521 | 5/2003 |
| JP | 2004-274035 | 9/2004 |
| JP | 2004-327856 | 11/2004 |
| JP | 2005-19814 | 1/2005 |
| JP | 2005-45251 | 2/2005 |
| JP | 2007-42762 | 2/2007 |

OTHER PUBLICATIONS

Japanese Official Action—2007-105852—Jun. 15, 2011.

* cited by examiner

*Primary Examiner* — Chuong A Luu
*Assistant Examiner* — Nga Doan
(74) *Attorney, Agent, or Firm* — Young & Thompson

(57) ABSTRACT

A semiconductor device, in which a semiconductor element is mounted on one side of a circuit board that is made up from an insulating layer and a wiring layer, includes metal posts provided on the side of the circuit board on which the semiconductor element is mounted; and a sealing layer provided on the side of the circuit board on which the semiconductor element is mounted such that the semiconductor element is covered and such that only portions of the metal posts are exposed.

14 Claims, 22 Drawing Sheets

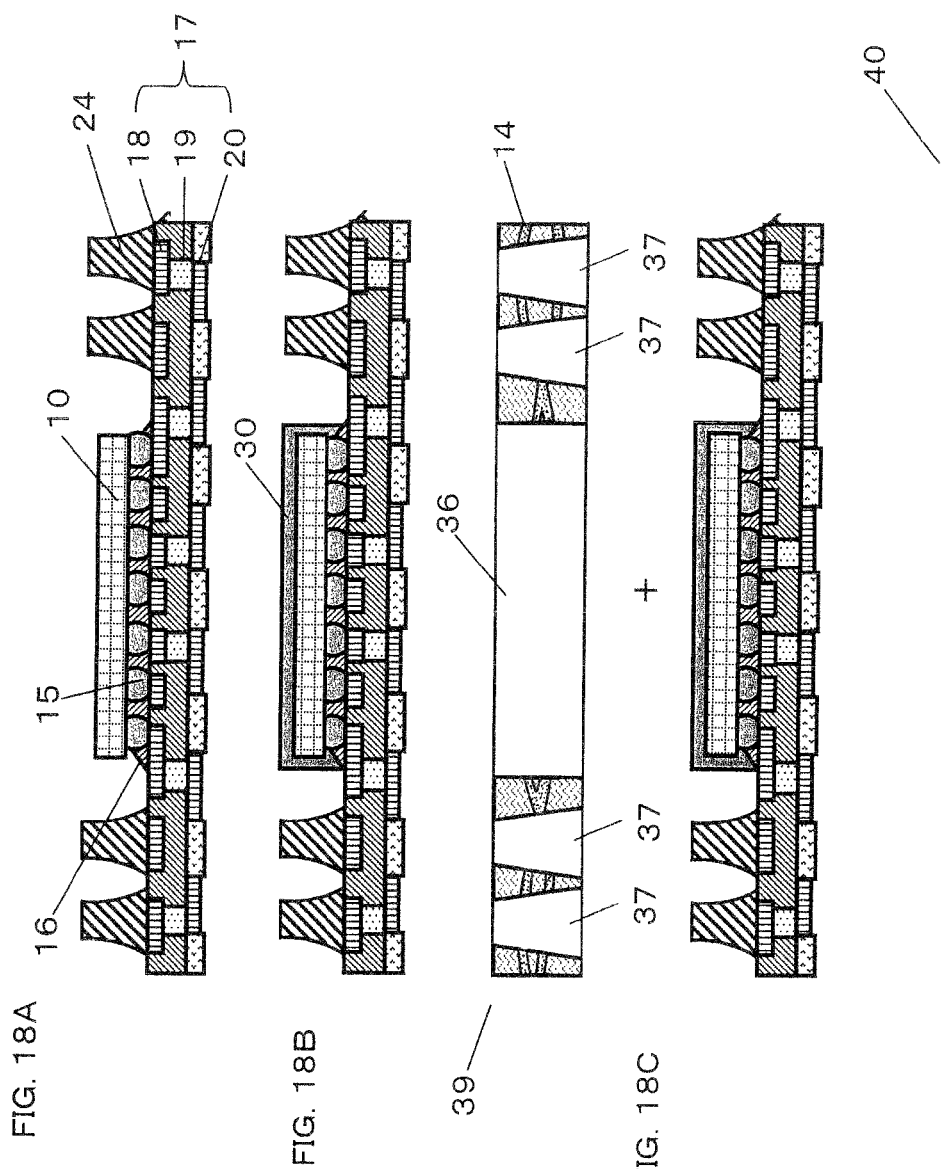

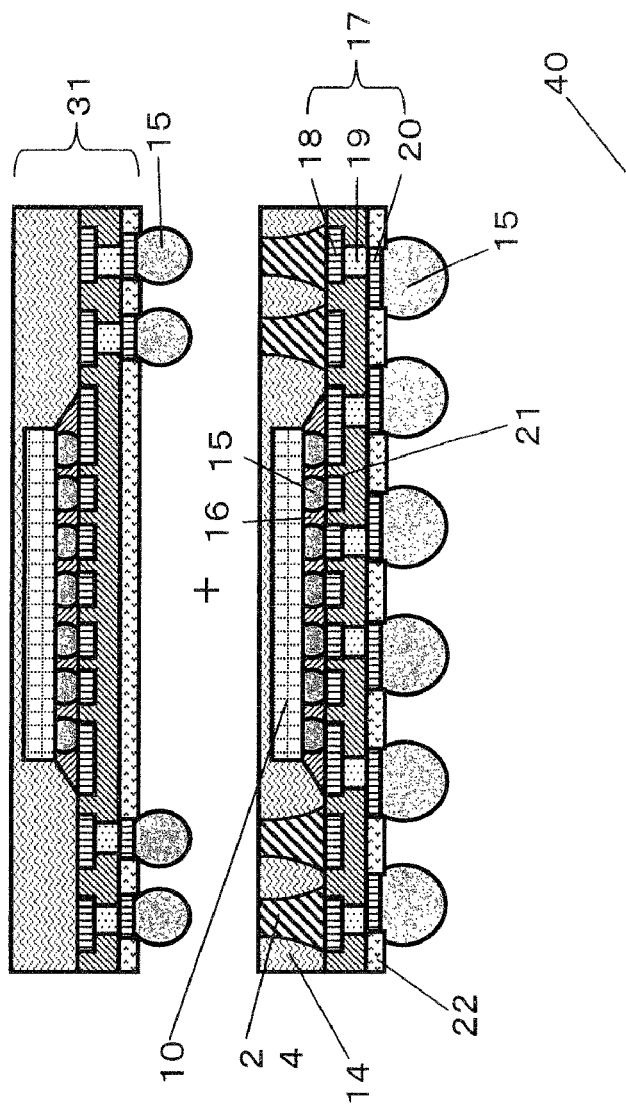
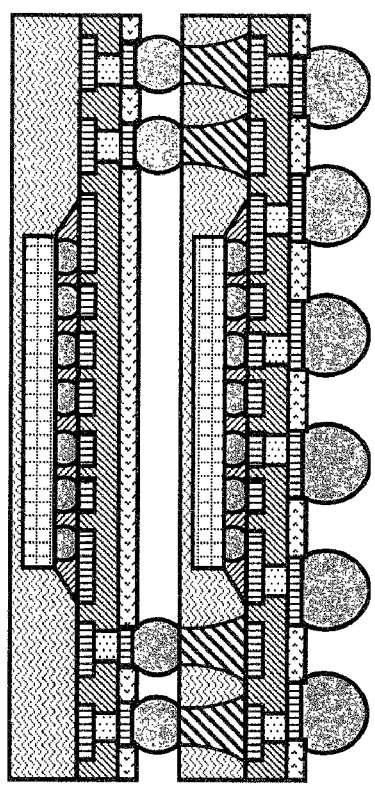
FIG. 20A
FIG. 20B

SEMICONDUCTOR DEVICE AND FABRICATION METHOD

This application is based upon and claims the benefit of priority from Japanese patent application No. 2007-105852, filed on Apr. 13, 2007, the disclosure of which is incorporated herein in its entirety by reference.

BACKGROUND OF THE INVENTION

1. Field of the Invention

The present invention relates to a semiconductor device for realizing a package for stacked package SiP that is thinner and less prone to warp, and to a method of fabricating such a semiconductor device.

2. Description of the Related Art

SiP (System in Package) is receiving attention as a technology for achieving smaller electronic apparatuses having higher functionality. Within SiP, stacked-package SiP (PoP, Package on Package) provides an easy solution to the problem of ensuring that products are defect-free. In addition, stacked-package SiP allows a high degree of freedom in combining chips. As a result, orders for stacked-package SiP are increasing, particularly for portable telephones.

However, stacked-package SiP have the problem of higher assembly height than stacked-semiconductor element SiP in which a plurality of semiconductor elements are stacked in one package. Stacked-package SiP further have the problems of greater package warp and swelling due to the thinning of the interposer substrate and partial molding in which only sites for mounting semiconductor elements are molded.

FIG. 1 is a sectional view showing a typical configuration of a lower package in stacked-package SiP. This package uses built-up circuit board 11 having core layer 12 as an interposer substrate. In this package, moreover, semiconductor element 10, which is a chip, is connected by wire bonding to built-up circuit board 11 by bonding wires 26. This package has a partially molded structure in which only the mounting site of semiconductor element 10 is sealed by sealing layer 14.

Various techniques have been proposed as countermeasures for the height of attachment and package warp.

For example, JP-A-2003-133521 describes a technique for lowering the profile of the assembly. More specifically, JP-A-2003-133521 describes a technique in which a package is fabricated by, rather than mounting a chip on a substrate, providing an opening in the substrate, mounting a chip face-up on a support tape on the bottom of the opening, connecting the chip by wire bonding, implementing partial molding of the chip site, and finally, mounting balls.

Alternatively, JP-A-2005-45251 discloses a technique for fabricating a package by mounting a chip on a substrate, mounting solder balls as external electrodes, molding the entire surface, and then grinding a portion of the solder balls and chip reverse surface.

As a countermeasure for warp of the package, JP-A-2007-42762 discloses a technique of varying the heights of electrodes that are formed on a lower package and that are the connectors with an upper package in order to ensure connection reliability when warp occurs.

Although both lower profile of the assembly height and reduced warp of the package are sought in stacked-package SiP, these two objects are difficult to achieve simultaneously in stacked-package SiP.

In the technique disclosed in JP-A-2003-133521, the thickness of a package is reduced by providing openings in the substrate and mounting semiconductor elements in these openings. However, such a package adopts a partially molded construction only for semiconductor elements, and as a result, warp is difficult to suppress at the ends of the package that are not sealed by molding.

In the technique disclosed in JP-A-2005-45251, a construction in which the entire surface is sealed by molding is realized by mounting a semiconductor element and solder balls on a substrate and then molding the entire surface. However, the reverse surface of the semiconductor element is exposed by grinding, and although the thickness of the package can be reduced, warp in the region of the semiconductor element is difficult to suppress.

In the technique disclosed in JP-A-2007-42762, the problem of connection defects resulting from warp when stacking an upper and lower package is solved by adjusting the height of electrodes on the lower package. However, when reducing the thickness of a substrate to achieve assembly height of a lower profile, warp of the package is difficult to absorb by merely adjusting the height of electrodes. Lower profile of the assembly height and reduced warp are therefore difficult to achieve simultaneously.

SUMMARY OF THE INVENTION

An exemplary object of the present invention is to provide a semiconductor device that can simultaneously achieve a lower profile of assembly height and reduced warp and a method of fabricating such a semiconductor device.

A semiconductor device according to an exemplary aspect of the invention is a semiconductor device, in which a semiconductor element is mounted on one side of a circuit board that is made up from an insulating layer and a wiring layer, and which includes metal posts provided on the side of the circuit board on which the semiconductor element is mounted; and a sealing layer provided on the side of the circuit board on which the semiconductor element is mounted such that the semiconductor element is covered and such that only portions of the metal posts are exposed.

A method according to an exemplary aspect of the invention is a method of fabricating a semiconductor device which includes forming a circuit board composed of an insulating layer and a wiring layer on a metal body; forming a mask on a surface of the metal body that is opposite a surface of the metal body that contacts the circuit board; forming metal posts by removing a portion of the metal body using the mask; mounting a semiconductor element on the circuit board on which the metal posts have been formed; embedding the semiconductor element and the metal posts in a sealing layer; and exposing surfaces of the metal posts that are opposite surfaces that contact the circuit board by removing a portion of the sealing layer.

The above and other objects, features, and advantages of the present invention will become apparent from the following description with reference to the accompanying drawings which illustrate an example of the present invention.

BRIEF DESCRIPTION OF THE DRAWINGS

FIG. 18A is a sectional view showing an example of the construction of a semiconductor device for explaining the method of fabricating the semiconductor device according to the third exemplary embodiment of the present invention;

FIG. 18B is a sectional view showing an example of the construction of a semiconductor device for explaining the method of fabricating the semiconductor device according to the third exemplary embodiment of the present invention;

FIG. 18C is a sectional view showing an example of the construction of a semiconductor device for explaining the method of fabricating the semiconductor device according to the third exemplary embodiment of the present invention;

FIG. 18D is a sectional view showing an example of the construction of a semiconductor device for explaining the method of fabricating the semiconductor device according to the third exemplary embodiment of the present invention;

FIG. 20A is a sectional view showing an example of the construction of a semiconductor device for explaining the method of fabricating the semiconductor device according to the fourth exemplary embodiment of the present invention; and FIG. 20B is a sectional view showing an example of the construction of a semiconductor device for explaining the method of fabricating the semiconductor device according to the fourth exemplary embodiment of the present invention.

DETAILED DESCRIPTION OF THE EXEMPLARY EMBODIMENTS

The exemplary embodiments of the present invention are next described specifically with reference to the accompanying figures.

Semiconductor Device

Figure 1:
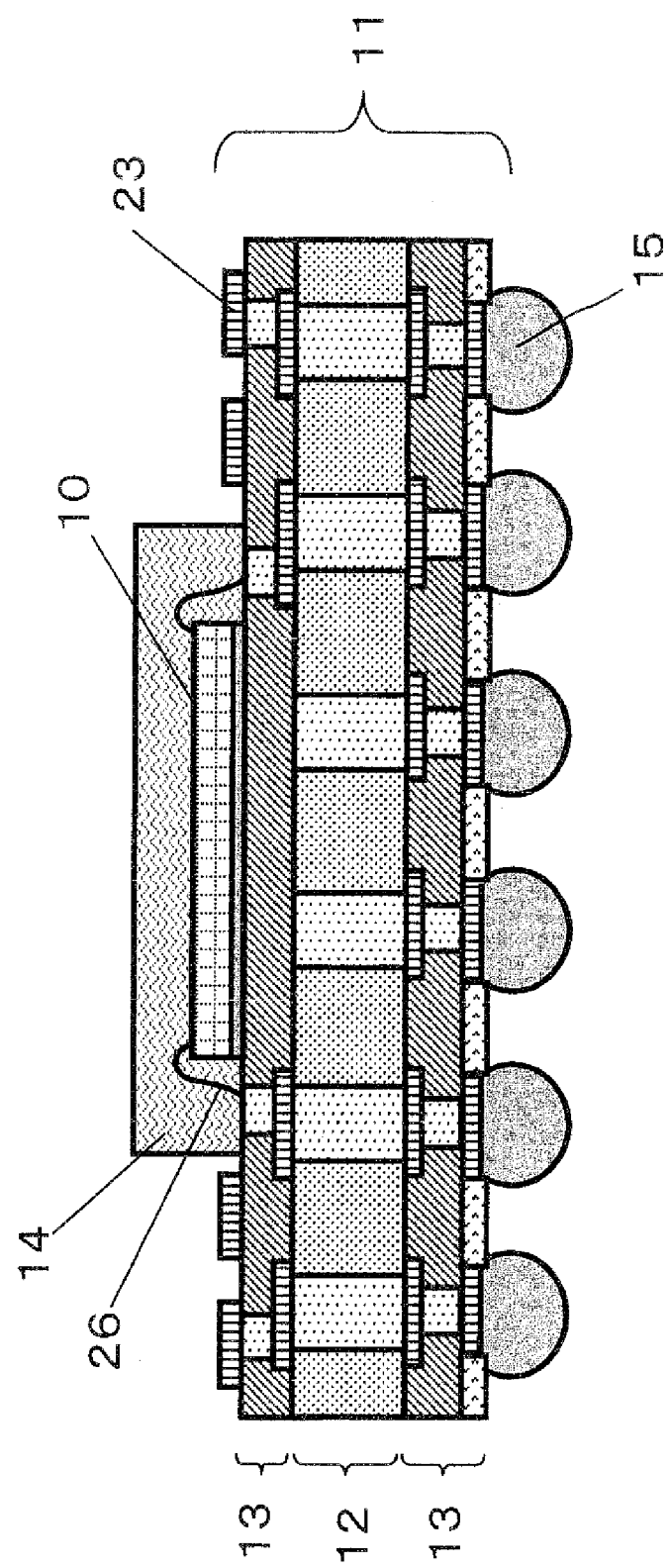
FIG. 1 is an explanatory view showing a typical construction of the lower package of a stacked-package SiP.
Figure 2:
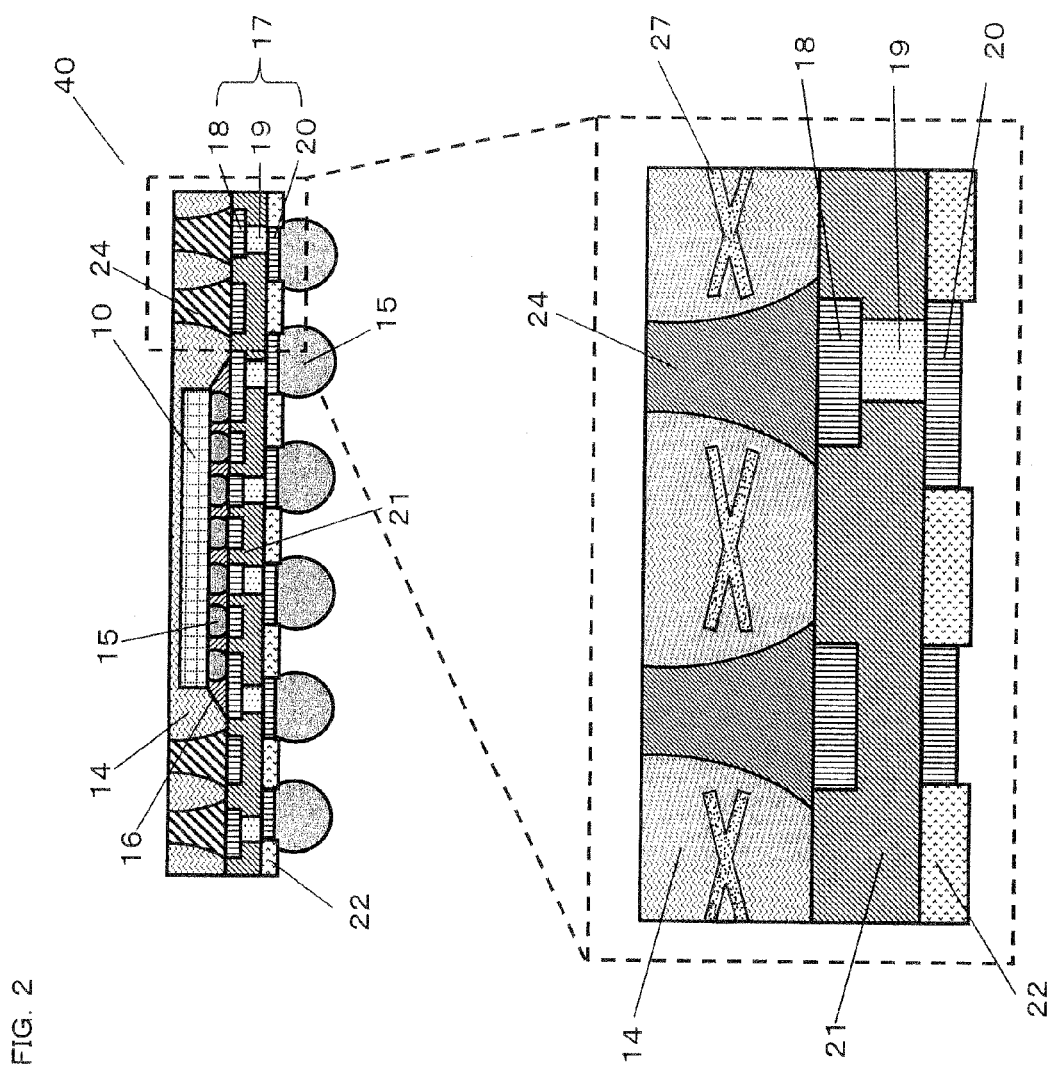
FIG. 2 is a sectional view showing an example of the construction of a semiconductor device according to the first exemplary embodiment of the present invention.

FIG. 2 is a sectional view showing an example of the construction of the semiconductor device according to the first exemplary embodiment of the present invention and a partial enlarged view of this semiconductor device.

Semiconductor device 40 shown in FIG. 2 includes circuit board 17. In circuit board 17, lower-layer wiring 18 is electrically connected to upper layer wiring 20 by way of vias 19. A plurality of metal posts 24, semiconductor element 10, and sealing layer 14 are provided on the lower-layer wiring 18 side of circuit board 17. Semiconductor element 10 is covered by sealing layer 14. Sealing layer 14 is also provided between the plurality of metal posts 24. The surfaces of metal posts 24, which are opposite the surfaces that contact circuit board 17 (only portions of metal posts 24), are exposed. Sealing layer 14 is formed from an organic material that includes reinforcement material 27.

Metal posts 24 are made up of, for example, any of copper, nickel, aluminum, gold, silver, palladium, platinum, iron, stainless steel, zinc, magnesium, titanium, 42-alloy, chromium, vanadium, rhodium, molybdenum, and cobalt, or a material of a plurality of these elements.

According to the purposes of lower cost and ease of processing, copper is particularly suited as metal posts 24. In the first exemplary embodiment, copper is used as metal posts 24.

Regarding the shape of metal posts 24, of the surfaces of metal posts 24 in the first exemplary embodiment, the area of the surfaces that contact circuit board 17 is greater than the area of the opposite surfaces, and the degree of contact between metal posts 24 and circuit board 17 is therefore high. As a result, sealing layer 14 can be easily processed even when sealing layer 14 is deposited in liquid or film form on metal posts 24.

In the first exemplary embodiment, the shape of metal posts 24 is not limited to the shape shown in FIG. 2. In addition, at least one of a plurality of metal posts 24 is connected to lower-layer wiring 18.

Semiconductor element 10 is electrically connected by way of solder balls 15 to circuit board 17 (more specifically, to lower-layer wiring 18). This connection is realized as a flip-chip connection. The space between semiconductor element 10 and circuit board 17 is filled with underfill resin 16.

Solder balls 15 are balls composed of a solder material. Solder balls 15 are attached on circuit board 17 by means of a plating method, ball transfer method, and printing method. Solder balls 15 are composed of lead-tin eutectic solder or lead-free solder.

Underfill resin 16 is made up from a material obtained by adding silica filler to an epoxy material. Underfill resin 16 decreases the difference between the thermal expansion coefficients of semiconductor element 10 and solder ball 15, and underfill resin 16 therefore prevents damage to solder balls 15. If solder balls 15 have sufficient rigidity to enable maintenance of high reliability, underfill resin 16 is unnecessary.

Regarding the bonding of circuit board 17 and semiconductor element 10, a conductive paste or copper bumps may be used in place of solder balls 15. In the first exemplary embodiment, solder balls 15 are used.

Figure 3:
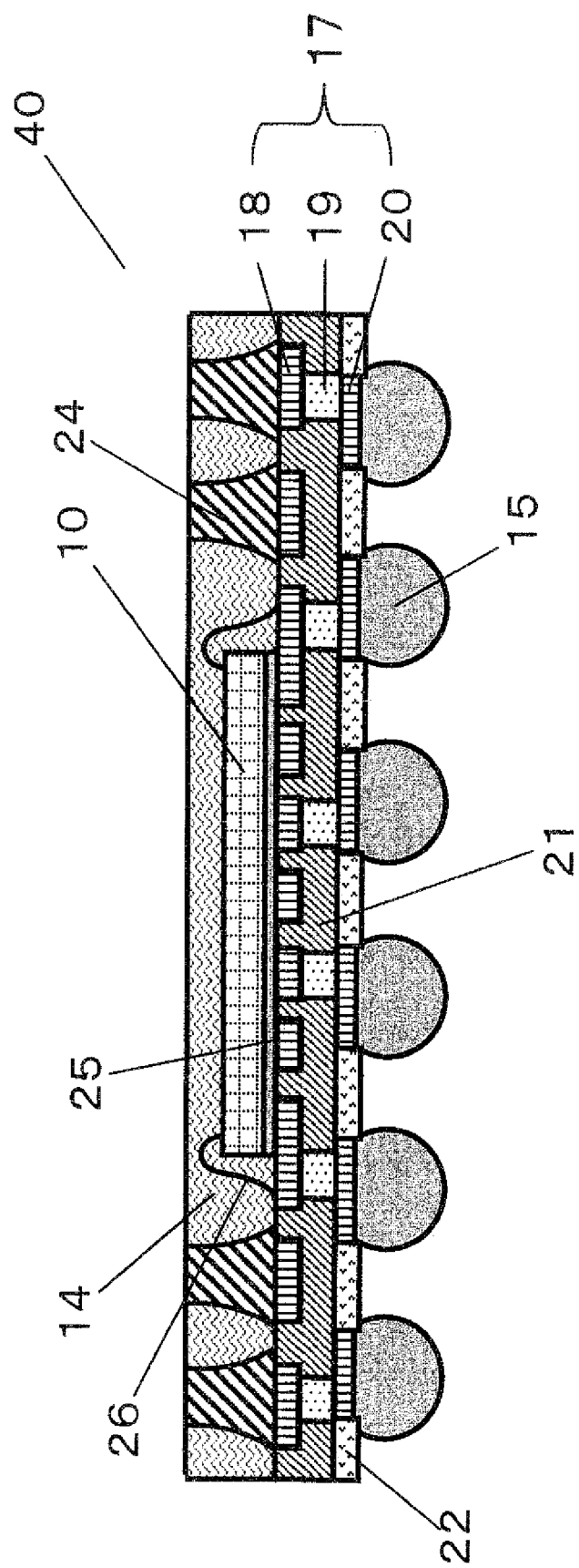
FIG. 3 is a sectional view showing a first modification of the construction of the semiconductor device according to the first exemplary embodiment of the present invention.
Figure 4:
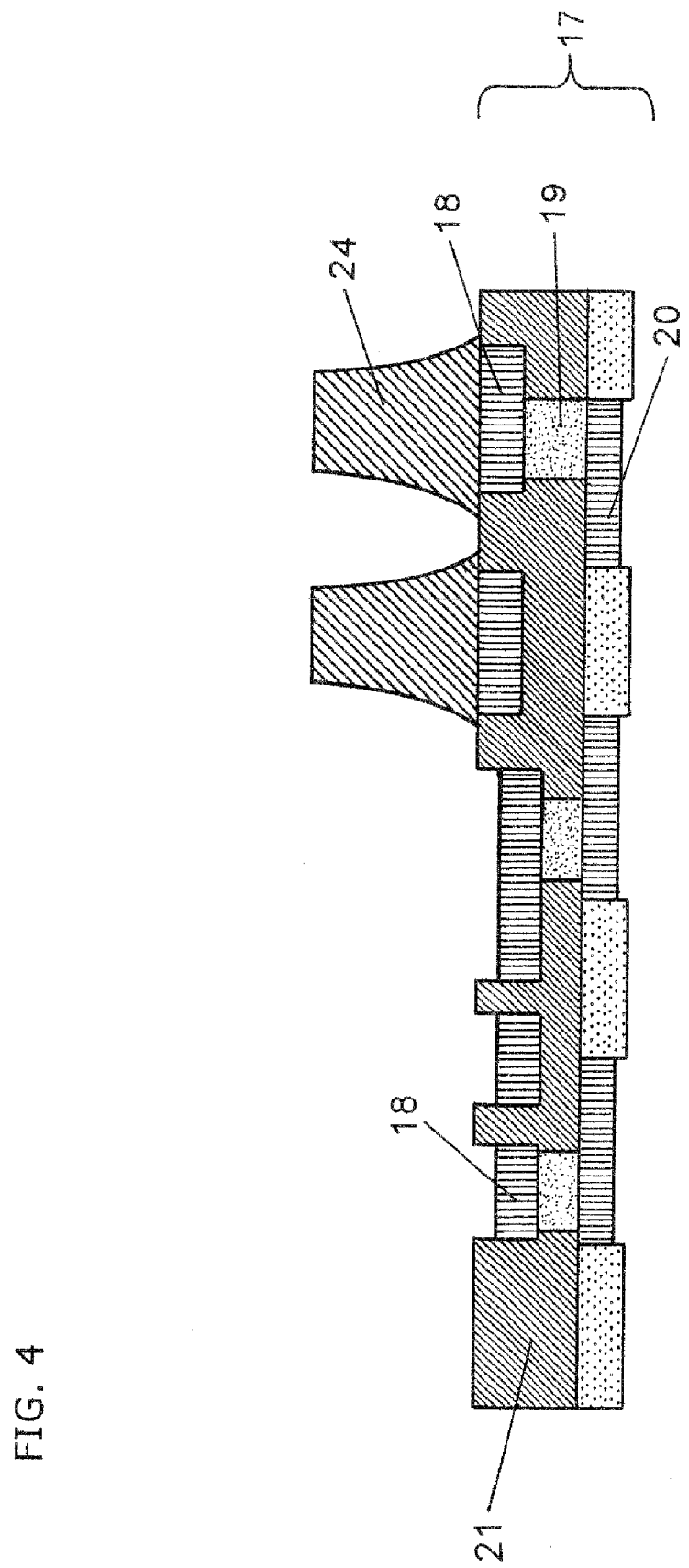
FIG. 4 is a sectional view showing a second modification of the construction of the semiconductor device according to the first exemplary embodiment of the present invention.

The method of connecting semiconductor element 10 and circuit board 17 is not limited to the method described above. For example, semiconductor element 10 may be adhered to circuit board 17 by adhesive 25 as shown in FIG. 3, or, of the surfaces of semiconductor element 10, the surface opposite the surface adhered to circuit board 17 may be connected to circuit board 17 (more specifically, lower-layer wiring 18) by bonding wires 26.

An organic material or silver paste may be used as adhesive 25. Bonding wires 26 are composed of a material chiefly composed of gold and electrically connect the electrodes of both semiconductor element 10 and circuit board 17.

Circuit board 17 is made up from, for example, at least one wiring layer and insulating layer, as shown in FIG. 2.

In FIG. 2, insulating layer 21 is of one layer while the wiring layers are the two layers: upper-layer wiring 20 and lower-layer wiring 18, but the insulating layer and the wiring layers are not limited to this form, and the insulating layer and the wiring layers may be of a configuration made up from a required number of layers.

Insulating layer 21 of circuit board 17 is formed of, for example, an organic material that is photosensitive or non-photosensitive. A material such as epoxy resin, epoxy-acrylate resin, urethane acrylate resin, polyester resin, phenol resin, polyimide resin, BCB (benzocyclobutene), PBO (polybenzoxazole), or polynorbornane resin may be used as the organic material. Alternatively, a material obtained by impregnating a woven fabric or a non-woven fabric formed from glass cloth or aramid fibers with epoxy resin, epoxy acrylate resin, urethane acrylate resin, polyester resin, phenol resin, polyimide resin, BCB (benzocyclobutene), PBO (polybenzoxazole) or polynorbornane resin may be used as the organic material. In the first exemplary embodiment, a glass cloth impregnated with epoxy resin is used as the organic material.

At least one metal selected from the group composed of copper, silver, gold, nickel, aluminum, and palladium or an alloy that takes these metals as a chief component is used as lower-layer wiring 18, upper-layer wiring 20, and vias 19 that are included in circuit board 17.

According to the standpoints of electrical resistance and cost, lower-layer wiring 18, upper-layer wiring 20, and vias 19 are preferably formed from copper.

In the first exemplary embodiment, lower-layer wiring 18, upper-layer wiring, 20, and vias 19 are formed from copper. A solder resist may be formed on insulating layer 21 such that a portion of upper-layer wiring 20 is exposed and the remaining portion of upper-layer wiring 20 is covered.

A portion of lower-layer wiring 18 in circuit board 17 having a surface on which metal posts 24 are provided may be level with insulating layer 21 or may be depressed with respect to insulating layer 21.

When the surfaces are even, electrode pads (not shown) that are made up from lower-layer wiring 18 can be applied to narrow pitches in the wire bonding connection between circuit board 17 and semiconductor element 10. In addition, the elimination of interference between the bonding wire tool and insulating layer 21 improves yield when making connections.

When the portion of lower-layer wiring 18 is depressed (see FIG. 3), insulating layer 21 functions as a resist in the flip-chip connection of semiconductor element 10. As a result, solder balls can be formed in only the depressed portions, thereby eliminating the need to separately provide a resist pattern for forming solder balls.

In addition, a capacitor may be provided in a desired position of circuit board 17 in order to serve as a noise filter of the circuit.

A metal oxide material such as titanium oxide, tantalum oxide, aluminum oxide ($Al_2O_3$), silicon dioxide ($SiO_2$), zirconium oxide ($ZrO_2$), hafnium oxide ($HfO_2$), or niobium pentoxide ($Nb_2O_5$) is preferably used as the dielectric material that makes up the capacitor. Alternatively, a perovskite material such as BST (barium strontium titanate) ($Ba_xSr_{1-x}TiO_3$), PZT (lead zirconate titanate) ($PbZr_xTi_{1-x}O_3$), or PLZT ($Pb_{1-y}La_yZr_xTi_{1-x}O_3$), or a Bi-series layered compound such as $SrBi_2Ta_2O_9$ may be used as the dielectric material. Here, the values "x" and "y" satisfy the relations $0 \leqq x \leqq 1$ and $0 < y < 1$. In addition, an organic material in which an inorganic or magnetic material is mixed may also be used as the dielectric material that makes up the capacitor.

Any of glass, aramid, liquid crystal polymer, and PTFE (polytetrafluoroethylene) is used as sealing layer 14. Alternatively, a material may be used as sealing layer 14 that is obtained by impregnating or laminating reinforcement material 27 composed of a plurality from among glass, aramid, liquid crystal polymer, and PTFE in an epoxy resin, epoxy acrylate resin, urethane acrylate resin, polyester resin, phenol resin, polyimide resin, BCB (benzocyclobutene), PBO (polybenzoxazole), or polynorbornane resin.

A low-cost process can be realized when reinforcement material 27 is glass. High water-vapor permeability can be achieved when reinforcement material 27 is aramid. Tensile strength and elastic modulus are improved when reinforcement material 27 is liquid crystal polymer. Heat resistance, shock resistance, and high insulation are improved when reinforcement material 27 is PTFE.

Figure 5:
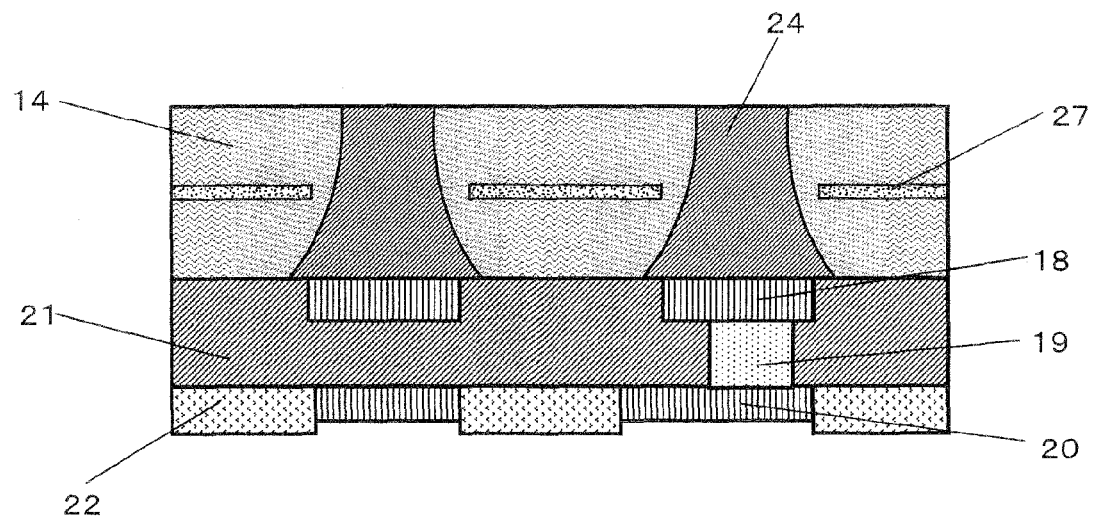
FIG. 5 is a sectional view showing a third modification of the construction of the semiconductor device according to the first exemplary embodiment of the present invention.

Reinforcement material 27 in FIG. 2 is a woven fabric. Reinforcement material 27 in FIG. 5 is a film. In either case, reinforcement material 27 does not contact metal posts 24, but reinforcement material 27 may contact metal posts 24 without causing problems.

The inclusion of reinforcement material 27 in sealing layer 14 enables an increase in the rigidity of sealing layer 14. When reinforcement material 27 is woven fabric, not only is the rigidity of sealing layer 14 increased, but surface variation of reinforcement material 27 can also be reduced and the ease of laser processing can be improved. When reinforcement material 27 is a non-woven fabric, not only is the rigidity of sealing layer 14 increased, but the water-vapor permeability of sealing layer 14 can also be increased. When reinforcement material 27 is a film, not only can the rigidity of sealing layer 14 be increased, but a thinner sealing layer 14 can also be achieved.

In the first exemplary embodiment, a glass woven fabric impregnated with epoxy resin is used as sealing layer 14.

Sealing layer 14 is preferably formed of a material that improves the rigidity of semiconductor device 40 by a material having a high modulus of elasticity. Alternatively, sealing layer 14 is preferably formed of a material that results in a small difference in thermal expansion between sealing layer 14 and circuit board 17 to avoid deterioration of the union of sealing layer 14 and insulating layer 21.

In addition, because sealing layer 14 can raise the rigidity of semiconductor device 40, circuit board 17 can be made thinner, whereby a semiconductor device can be realized with a low profile and little warp.

According to the first exemplary embodiment, semiconductor element 10 and metal posts 24 are secured by sealing layer 14 that includes reinforcement material 27. As a result, sealing layer 14 can increase the rigidity of semiconductor device 40 and realize reduced warp of semiconductor device 40. Further, because sealing layer 14 can increase the rigidity of semiconductor device 40, circuit board 17 can be made thinner. Using a thin substrate as circuit board 17 can realize semiconductor device 40 that has little warp, and moreover, that is thin.

Figure 6:
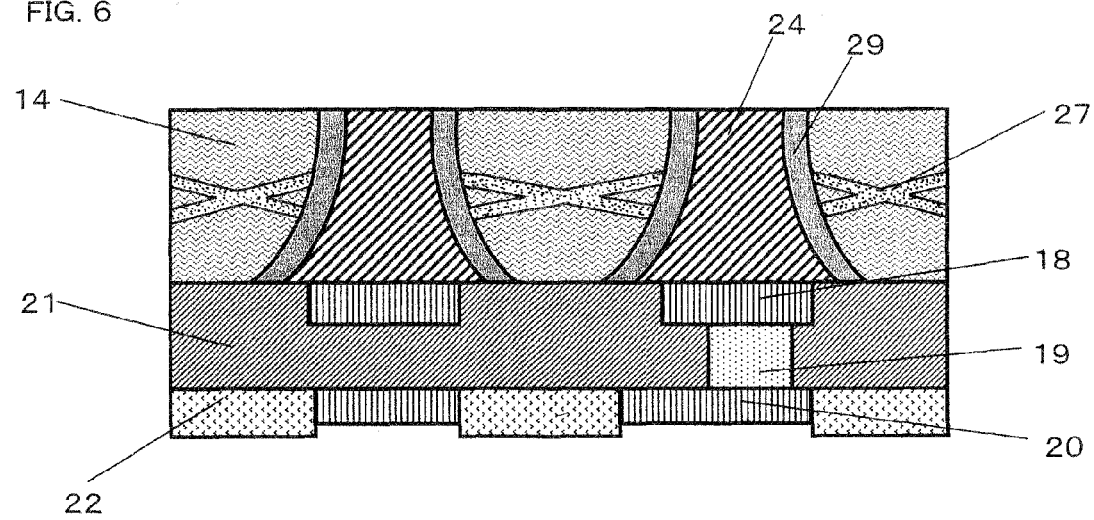
FIG. 6 is a sectional view showing an example of the construction of the semiconductor device according to the second exemplary embodiment of the present invention.

FIG. 6 is a sectional view showing an example of the construction of the semiconductor device according to the second exemplary embodiment of the present invention.

The semiconductor device according to the second exemplary embodiment includes circuit board 17 in which lower-layer wiring 18 is electrically connected to upper-layer wiring 20 by way of via 19. A plurality of metal posts 24, semiconductor element 10, and sealing layer 14 are provided on the lower-layer wiring 18 side of circuit board 17. Semiconductor element 10 is covered by sealing layer 14. Sealing layer 14 is also provided between the plurality of metal posts 24. Of the surfaces of metal posts 24, the surfaces opposite the surfaces that contact circuit board 17 are exposed. Sealing layer 14 is formed of an organic material that includes reinforcement material 27. Embedding material 29 is provided between reinforcement material 27 and semiconductor element 10 or metal posts 24 (around the peripheries of metal posts 24).

FIG. 6 is an enlarged view of the portion of metal posts 24 and reinforcement material 27 and embedding material 29 of the semiconductor device according to the second exemplary embodiment.

The following explanation regards the differences with respect to the semiconductor device according to the first exemplary embodiment. Parts that are not specifically described are the same as in the description of the semiconductor device according to the first exemplary embodiment.

Embedding material 29 is formed of an organic material that is photosensitive or non-photosensitive. The organic material is a material such as epoxy resin, epoxy acrylate resin, urethane acrylate resin, polyester resin, phenol resin, polyimide resin, BCB (benzocyclobutene), PBO (polybenzoxazole), and polynorbornane resin. Embedding material 29 does not include reinforcement material 27.

In addition, embedding material 29 preferably has a lower modulus of elasticity than sealing layer 14 to function as a stress-relief layer.

In addition, the use of embedding material 29 can secure the outer periphery of metal posts 24 or semiconductor element 10, and the other areas can be secured by sealing layer 14. Adopting different resins for each area enables the selection of the optimum organic material for warp in each of the areas.

According to the second exemplary embodiment, semiconductor element 10 and metal posts 24 are indirectly secured by sealing layer 14 that includes reinforcement material 27. As a result, the rigidity of semiconductor device 40 can be increased by sealing layer 14, and lower warp of semiconductor device 40 can be realized.

In addition, circuit board 17 can be made thinner because sealing layer 14 can increase the rigidity of semiconductor device 40. The use of a thin substrate as circuit board 17 enables the realization of a thin semiconductor device 40 with low warp.

The use of embedding material 29 provided between reinforcement material 27 and semiconductor element 10 or metal posts 24 with a less elastic resin than sealing layer 14 allows these components to function as a stress-relief layer, whereby the reliability of the semiconductor device as a separate entity and the reliability at the time of secondary packaging are improved.

The use of embedding material 29 allows the outer periphery of metal posts 24 or semiconductor element 10 to be secured by embedding material 29 and allows the other areas to be secured by sealing layer 14. Adopting different resins for each of the areas enables selection of the ideal organic material for countering warp, whereby a further suppression of warp of the semiconductor device can be achieved.

Figure 7:
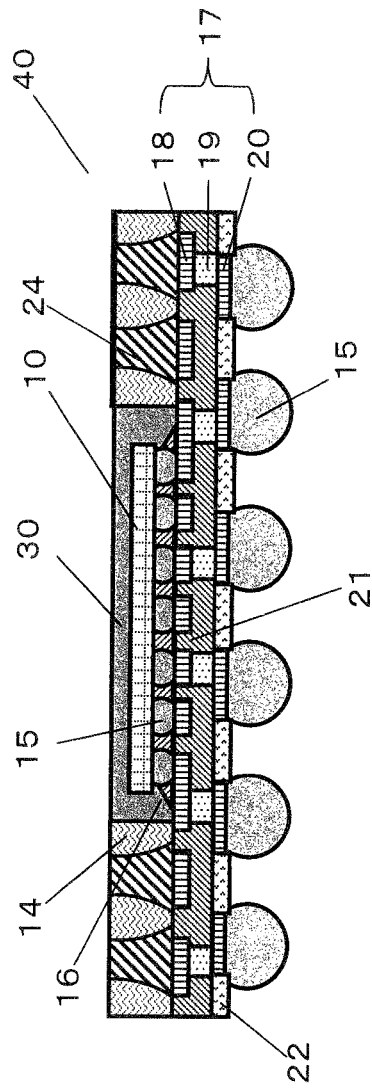
FIG. 7 is a sectional view showing an example of the construction of the semiconductor device according to the third exemplary embodiment of the present invention.

FIG. 7 is a sectional view showing an example of the construction of the semiconductor device according to the third exemplary embodiment of the present invention.

Semiconductor device 40 shown in FIG. 7 includes circuit board 17 in which lower-layer wiring 18 is electrically connected to upper-layer wiring 20 by way of via 19. A plurality of metal posts 24, semiconductor element 10, and sealing layer 14 are provided on the lower-layer wiring 18 side of circuit board 17. Sealing layer 14 is provided between the plurality of metal posts 24. Of the surfaces of metal posts 24, the surfaces opposite the surfaces that contact circuit board 17 are exposed. Sealing layer 14 is formed of an organic material that includes reinforcement material 27. Semiconductor element 10 is embedded in semiconductor element sealing layer 30. Sealing layer 14 and semiconductor element sealing layer 30 function as sealing layers.

The following explanation regards the portions of semiconductor device 40 that differ from the first exemplary embodiment. Parts that are not specifically described are the same as described in the first exemplary embodiment.

Semiconductor element sealing layer 30 is formed of an organic material that is photosensitive or non-photosensitive. The organic material is, for example, epoxy resin, epoxy acrylate resin, urethane acrylate resin, polyester resin, phenol resin, polyimide resin, BCB (benzocyclobutene), PBO (polybenzoxazole), or polynorbornane resin. Semiconductor element sealing layer 30 is formed of a different material than sealing layer 14. A reinforcement material (not shown) may be provided on the surface opposite the connection surface with circuit board 17 or on the outer periphery of semiconductor element 10.

Figure 8:
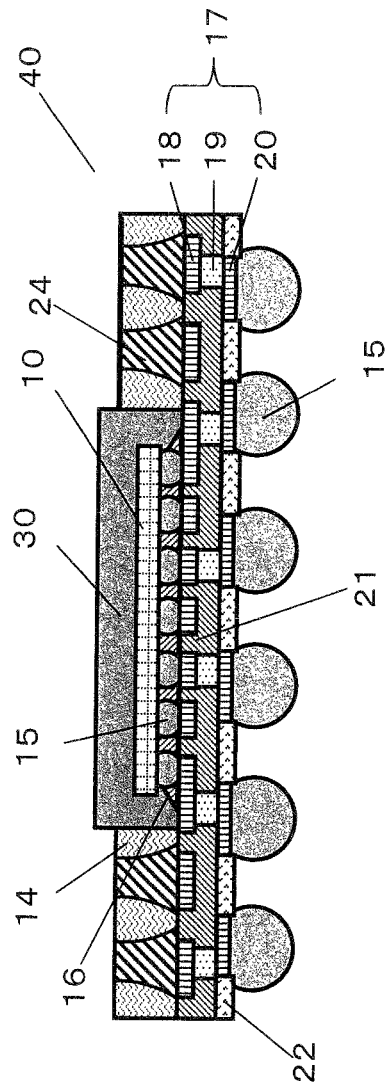
FIG. 8 is a sectional view showing a first modification of the construction of the semiconductor device according to the third exemplary embodiment of the present invention.
Figure 9:
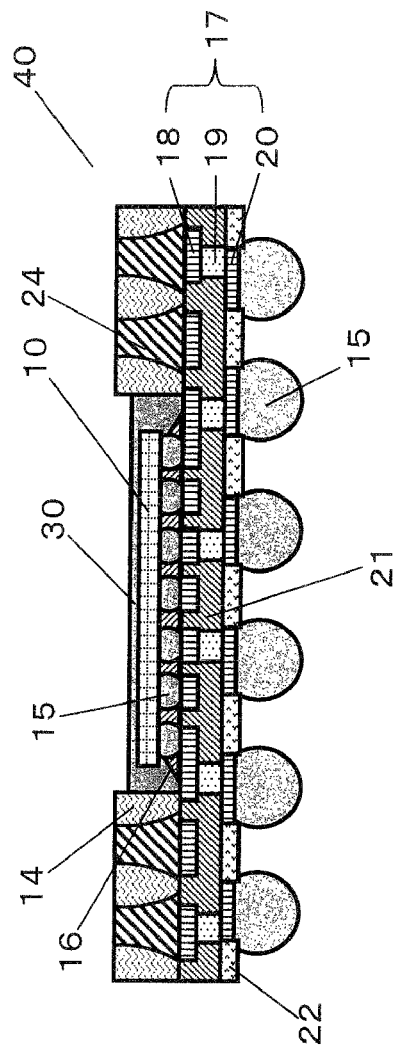
FIG. 9 is a sectional view showing a second modification of the construction of the semiconductor device according to the third exemplary embodiment of the present invention.

In addition, as shown in each of FIGS. 8 and 9, semiconductor element sealing layer 30 may project above, or be depressed below sealing layer 14.

When semiconductor element sealing layer 30 protrudes, semiconductor element 10 can be made thicker. Increasing the thickness of the resin of semiconductor element sealing layer 30 on semiconductor element 10 enables a reduction of warp on semiconductor element 10.

Alternatively, when semiconductor element sealing layer 30 is depressed, semiconductor element 10 can be made thinner and the assembly height when connected with other semiconductor devices can be reduced.

Figure 10:
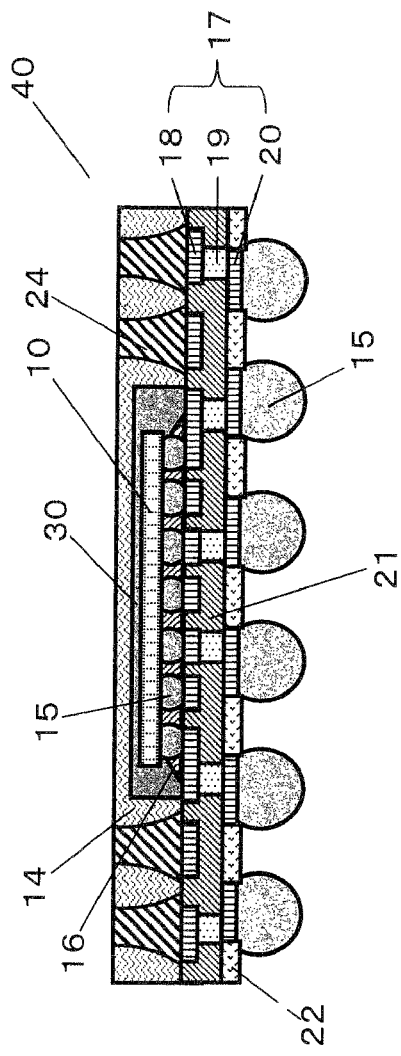
FIG. 10 is a sectional view showing a third modification of the construction of the semiconductor device according to the third exemplary embodiment of the present invention.

In addition, as shown in FIG. 10, sealing layer 14 may further embed semiconductor element sealing layer 30 that embeds semiconductor element 10.

According to the third exemplary embodiment, semiconductor element 10 and metal posts 24 are secured by sealing layer 14 that includes reinforcement material 27. The rigidity of semiconductor device 40 can therefore be increased by sealing layer 14, and lower warp of semiconductor device 40 can be achieved. In addition, sealing layer 14 increases the rigidity of semiconductor device 40, whereby circuit board 17 can be made thinner. Using a thin substrate as circuit board 17 enables the realization of semiconductor device 40 that is both thin and has reduced warp.

Still further, using sealing layer 14 to seal metal posts 24 and using semiconductor element sealing layer 30 to seal semiconductor element 10 allows the selection of the optimum organic material for reducing warp in the respective areas, whereby a greater suppression of warp of the semiconductor device can be achieved.

In addition, the heights of semiconductor element sealing layer 30 and sealing layer 14 can be freely adjusted. When semiconductor element sealing layer 30 protrudes more than sealing layer 14, semiconductor element 10 can be made thicker, and the rigidity of semiconductor element 10 can be improved. Increasing the resin thickness of semiconductor element sealing layer 30 on semiconductor element 10 can further reduce warp on semiconductor element 10.

Alternatively, when semiconductor element sealing layer 30 is depressed, the solder balls of the semiconductor device that is connected on the upper side can be made a smaller diameter, whereby the assembly height can be further reduced.

Figure 11:
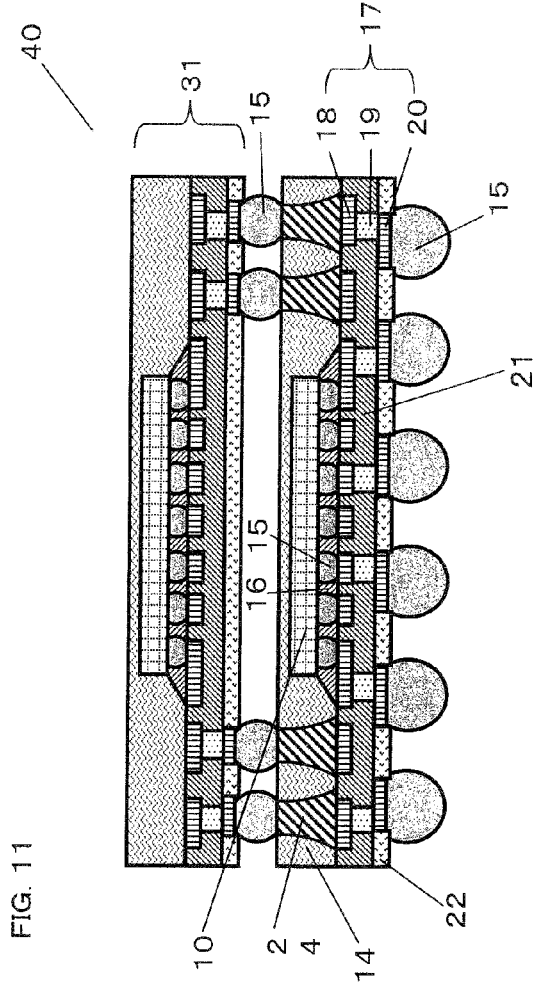
FIG. 11 is a sectional view showing an example of the construction of the semiconductor device according to the fourth exemplary embodiment of the present invention.

FIG. 11 is a sectional view showing the construction of the semiconductor device according to the fourth exemplary embodiment of the present invention.

In the semiconductor device shown in FIG. 11, a plurality of metal posts 24, semiconductor element 10, and sealing layer 14 are provided on the lower-layer wiring 18 side of circuit board 17. Semiconductor element 10 is covered by sealing layer 14. Sealing layer 14 is further provided between the plurality of metal posts 24. Of the surfaces of metal posts 24, the surfaces opposite the surfaces that contact circuit board 17 are exposed. The semiconductor device shown in FIG. 11 has a configuration that includes two semiconductor devices that are stacked with these exposed surfaces connected to the other semiconductor device by way of an interposed connection material.

At least one of metal posts 24 is connected to lower-layer wiring 18 and functions as an external terminal part. The function as an external terminal should include at least the function of electrical connection to an external element.

In FIG. 11, the semiconductor device shown in FIG. 2 is used as the lower semiconductor device, but any of the first to third exemplary embodiments may be used for this semiconductor device.

In FIG. 11, one semiconductor element 10 is mounted on each of the semiconductor devices, but a plurality of elements may be mounted.

Still further, two semiconductor devices are stacked in FIG. 11, but three or more semiconductor devices may be stacked.

Figure 12:
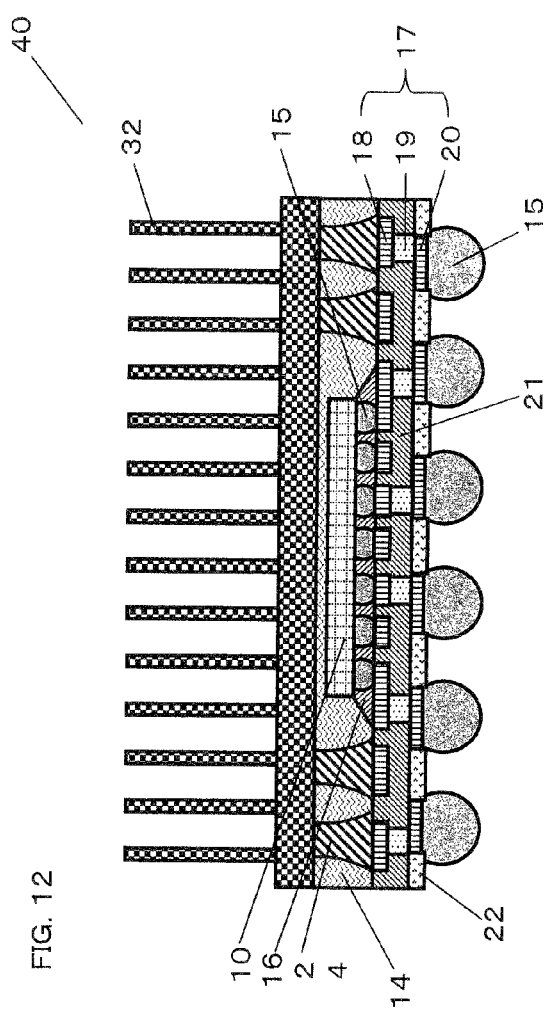
FIG. 12 is a sectional view showing a first modification of the construction of the semiconductor device according to the fourth exemplary embodiment of the present invention.

Alternatively, a high heat-discharge semiconductor device may also be formed by not stacking semiconductor devices but rather, mounting heat sink 32 on metal posts 24 as shown in FIG. 12.

Heat sink 32 is made up from copper, nickel, aluminum, gold, silver, palladium, platinum, iron, stainless steel, zinc, magnesium, titanium, 42-alloy, chromium, vanadium, rhodium, molybdenum, or cobalt, or from a material of a plurality of these elements. According to the standpoints of cost and ease of processing, copper is particularly suitable as heat sink 32. In the fourth exemplary embodiment, copper is used as heat sink 32.

Heat sink 32 may further be formed with fins as shown in FIG. 12, or may be formed without fins. For connecting heat sink 32 and semiconductor device 40, an adhesive layer (not shown) may be formed over the entire surface of semiconductor device 40, or an adhesive layer (not shown) may be formed at points other than the exposed surfaces of metal posts 24.

According to the fourth exemplary embodiment, semiconductor element 10 and metal posts 24 are secured by sealing layer 14 that includes reinforcement material 27. As a result, the rigidity of semiconductor device 40 can be increased by sealing layer 14 and semiconductor device 40 with lower warp can be realized. Further, the rigidity of semiconductor device 40 can be increased by sealing layer 14, whereby circuit board 17 can be made thinner.

Using a thin substrate as circuit board 17 enables the realization of semiconductor device 40 that is both thin and subject to less warp.

The stacked configuration of the semiconductor device has such advantages as allowing stacking of the semiconductor device in a plurality of levels, increasing the degree of freedom in the assembly of semiconductor elements, and increasing the flexibility of, for example, processing changes in memory capacity.

In addition, a high heat-discharge semiconductor device can be realized by mounting a heat sink.

Method of Fabricating the Semiconductor Device

FIGS. 13A to 13L are sectional views showing the steps of a method of fabricating a semiconductor device according to the first exemplary embodiment of the present invention in order. This method is for fabricating a semiconductor device according to the first embodiment such as shown in FIG. 2.

Figure 13A:
FIG. 13A is a sectional view showing an example of the construction of a semiconductor device for explaining the method of fabricating the semiconductor device according to the first exemplary embodiment of the present invention.

First, as shown in FIG. 13A, metal body 33 is subjected to the processes of wet cleaning, dry cleaning, leveling, and roughening as necessary.

Metal body 33 is ultimately caused to function as metal posts 24. Consequently, at least one metal selected from the group of copper, aluminum, nickel, stainless steel, iron, magnesium, and zinc, or an alloy that takes these metals as principal components is used as metal body 33. The selection of copper as metal body 33 is particularly desirable according to the standpoints of electrical resistance and cost. Copper is used in the present embodiment.

Figure 13B:
FIG. 13B is a sectional view showing an example of the construction of a semiconductor device for explaining the method of fabricating the semiconductor device according to the first exemplary embodiment of the present invention.

Next, as shown in FIG. 13B, lower-layer wiring 18 is formed on metal body 33 by means of, for example, a subtractive method, a semi-additive method, or a full-additive method.

A subtractive method is a method of obtaining a desired pattern by forming a resist of a desired pattern on a copper foil provided on the substrate, and, after etching unnecessary copper foil, stripping off the resist.

A semi-additive method is a method of obtaining a desired wiring pattern by forming a power-supply layer by an electroless plating method, a sputtering method, or a CVD (chemical vapor deposition) method, then forming a resist in which openings are provided in a desired pattern, depositing metal by an electroplating method in the resist openings, and then, after removing the resist, etching the power-supply layer.

A full-additive method is a method of obtaining a desired wiring pattern by adsorbing an electroless plating catalyst on a substrate, then forming a pattern by a resist, activating the catalyst with this resist left unchanged as an insulating film, and then depositing metal in the openings of the insulating film by an electroless plating method.

At least one metal selected from the group composed of, for example, copper, silver, gold, nickel, aluminum, and palladium, or an alloy that takes these metals as chief components is used as lower-layer wiring 18. Lower-layer wiring 18 is preferably formed from copper according to the standpoints of electrical resistance and cost. In the present embodiment, copper is used.

Figure 13C:
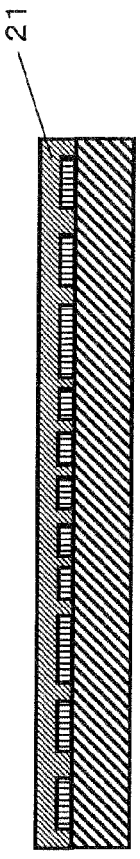
FIG. 13C is a sectional view showing an example of the construction of a semiconductor device for explaining the method of fabricating the semiconductor device according to the first exemplary embodiment of the present invention.

Next, as shown in FIG. 13C, insulating layer 21 is laminated on lower-layer wiring 18.

Insulating layer 21 is formed of, for example, an organic material that is photosensitive or non-photosensitive. A material such as epoxy resin, epoxy acrylate resin, urethane acrylate resin, polyester resin, phenol resin, polyimide resin, BCB (benzocyclobutene), PBO (polybenzoxazole), or polynorbornane resin is used as the organic material. Alternatively, a woven fabric or non-woven fabric formed of glass cloth or aramid fibers that is impregnated with, for example, epoxy resin, epoxy acrylate resin, urethane acrylate resin, polyester resin, phenol resin, polyimide resin, BCB (benzocyclobutene), PBO (polybenzoxazole), or polynorbornane resin may be used as the organic material. In the present embodiment, a glass cloth impregnated with epoxy resin is used.

Figure 13D:
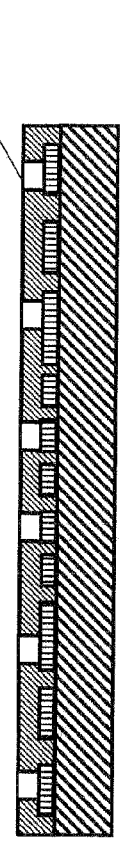
FIG. 13D is a sectional view showing an example of the construction of a semiconductor device for explaining the method of fabricating the semiconductor device according to the first exemplary embodiment of the present invention.

Next, as shown in FIG. 13D, via-holes 34 are formed in insulating layer 21.

When insulating layer 21 is formed of a photosensitive material, via-holes 34 are formed by photolithography. When insulating layer 21 is a non-photosensitive material, or when insulating layer 21 is a photosensitive material but formed of a material having low pattern resolution, via-holes 34 are formed by a laser processing method, a dry etching method, or a blast method. In the present embodiment, a laser processing method is used.

Figure 13E:
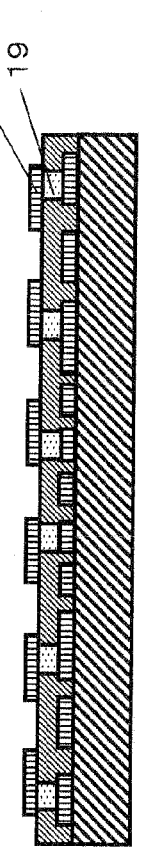
FIG. 13E is a sectional view showing an example of the construction of a semiconductor device according to the first exemplary embodiment of the present invention.

Next, as shown in FIG. 13E, vias 19 are formed by filling the insides of via-holes 34 with at least one metal of the group composed of, for example, copper, silver, gold, nickel, aluminum, and palladium, or an alloy that takes these metals as chief components.

In the present embodiment, copper is used. The filling method is implemented by electroplating, electroless plating, printing, or a molten metal suction method.

Alternatively, a method may be employed in which conductor posts are formed in advance at the positions of vias 19, following which insulating layer 21 is formed and the surface of insulating layer 21 then ground by polishing/grinding to expose the conductor posts and thus form vias 19. Alternatively, vias 19 may be formed in the same step as upper-layer wiring 20 described hereinbelow.

Upper-layer wiring 20 is further formed on vias 19 by a method such as a subtractive method, a semi-additive method, or a full-additive method.

At least one metal selected from the group composed of, for example, copper, silver, gold, nickel, aluminum, and palladium, or an alloy that takes these metals as chief components is used as upper-layer wiring 20. Upper-layer wiring 20 is preferably formed from copper, particularly according to the standpoints of electrical resistance and cost. In the present embodiment, a semi-additive method is used, and copper is employed for upper-layer wiring 20.

Figure 13F:
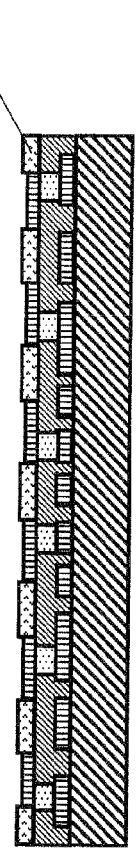
FIG. 13F is a sectional view showing an example of the construction of a semiconductor device for explaining the method of fabricating the semiconductor device according to the first exemplary embodiment of the present invention.

Next, as shown in FIG. 13F, a pattern of solder resist 22 is formed on upper-layer wiring 20.

Solder resist 22 is formed for producing the flame resistance and surface circuit protection of circuit board 17. This material may be composed of an organic material such as an epoxy, acryl, urethane, or polyimide; and an inorganic or organic filler material may be used as an additive according to necessity. In addition, it is not necessary that solder resist 22 be provided on the circuit board.

Although an example was shown in FIG. 13B in which circuit board 17 is formed starting from the formation of a wiring layer, circuit board 17 may also be formed starting from an insulating layer.

In FIG. 13, an example is shown in which circuit board 17 is composed of two conductive layers and one insulating layer, circuit board 17 may also be formed by repeating the above-described steps a number of times corresponding to the desired number of layers.

Figure 13G:
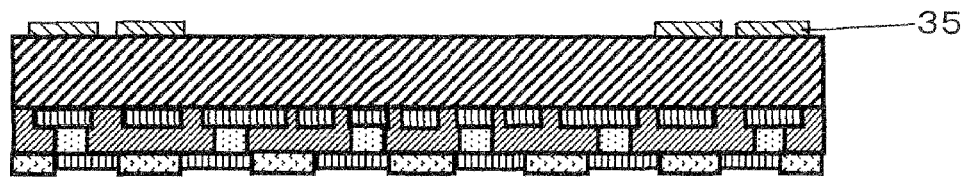
FIG. 13G is a sectional view showing an example of the construction of a semiconductor device for explaining the method of fabricating the semiconductor device according to the first exemplary embodiment of the present invention.

Next, as shown in FIG. 13G, metal post mask 35, which is formed using at least one organic material or at least one metal material that differs from that of metal body 33, is formed to a thickness of from 0.01 μm to 100 μm at desired positions at which metal posts 24 are to be provided on, of the surfaces of metal body 33, the surface opposite the surface that contacts circuit board 17.

If mask 35 is formed of an organic material, and if the organic material is in liquid form, mask 35 is laminated by means of a spin coating method, die coating method, curtain coating method, or printing method. If the organic material is a dry film, mask 35 is laminated by, for example, a lamination method.

After laminating the organic material, the organic material is cured by a process such as drying, following which the organic material is formed at desired positions at which metal posts 24 are to be provided by, for example, photo-processing if the organic material is photosensitive or by, for example, a laser processing method if the organic material is non-photosensitive.

When mask 35 is formed from a metal material, a plating resist is laminated on, of the surfaces of metal body 33, the surface opposite the surface that contacts circuit board 17.

If the plating resist is in liquid form, the plating resist is laminated by means of a spin coating method, a die coating method, a curtain coating method, or a printing method; and if the plating resist is a dry film, the plating resist is laminated by a lamination method.

After laminating the plating resist, the plating resist is cured by, for example, a drying process, following which openings in the plating resist are provided at desired positions at which metal posts 24 are to be provided by means of photo-processing if the plating resist is photosensitive or by means of a laser processing method if the plating resist is non-photosensitive.

A metal material that differs from that of metal body 33 is then deposited in the openings of the plating resist by means of a electroplating method or an electroless plating method, following which the plating resist is removed, whereby the metal material is formed at desired positions at which metal posts 24 are to be provided.

In the present embodiment, a metal material (nickel) is applied in mask 35, a photosensitive liquid plating resist (trade name PMER P-LA900 manufactured by Tokyo Ohka Kogyo, Ltd.) is used for the plating resist, the plating resist is applied to metal body 33 by a spin coating method, openings are provided in the plating resist by photolithography, nickel is electroplated in the openings of the plating resist by an electroplating method, and the thickness was set to 10 μm.

Figure 13H:
FIG. 13H is a sectional view showing an example of the construction of a semiconductor device for explaining the method of fabricating the semiconductor device according to the first exemplary embodiment of the present invention.

Next, as shown in FIG. 13H, metal body 33 is subjected to an etching process using an etchant from the upper surface of mask 35.

A dip method or a spray method is used as the etching method. In the present embodiment, a spray etching method was employed that uses an alkaline copper etchant having ammonia as a chief ingredient (trade name E-Process, manufactured by Meltex, Inc.).

Figure 13I:
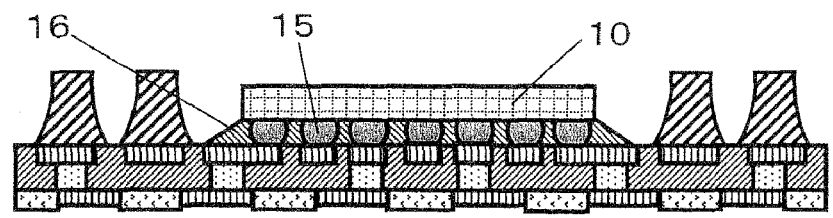
FIG. 13I is a sectional view showing an example of the construction of a semiconductor device for explaining the method of fabricating the semiconductor device according to the first exemplary embodiment of the present invention.

Next, as shown in FIG. 13I, semiconductor element 10 is flip-chip connected to circuit board 17 by way of solder balls 15 on, of the surfaces of circuit board 17, the surface opposite the surface on which metal posts 24 are formed.

Underfill resin 16 is then used to fill the space between semiconductor element 10 and circuit board 17 on which solder balls 15 are formed.

Underfill resin 16 is used with the object of reducing the difference in thermal expansion coefficients of semiconductor element 10 and solder balls 15 and preventing damage to solder balls 15.

If solder balls 15 have sufficient strength to maintain the desired reliability, filling the space with underfill resin 16 is not necessary.

Solder balls 15 are micro-balls composed of a solder material and are formed by a plating method, ball transfer, and a printing method. The material of solder balls 15 can be selected as appropriate from lead-tin eutectic solder and lead-free solder materials.

Underfill resin 16 is formed from an epoxy material. Underfill resin 16 is applied after semiconductor element 10 is connected by means of solder balls 15.

In addition, the connection between semiconductor element 10 and circuit board 17 may be implemented by bumps of a metal such as copper and not by micro-balls composed of a solder material.

Although the form of connecting semiconductor element 10 described in FIG. 13I uses flip-chip connection, connection by means of wire bonding, or connection in which wires of the wiring board are directly connected to connection terminal parts of semiconductor element 10 without using bumps or wire bonding may also be used.

Figure 13J:
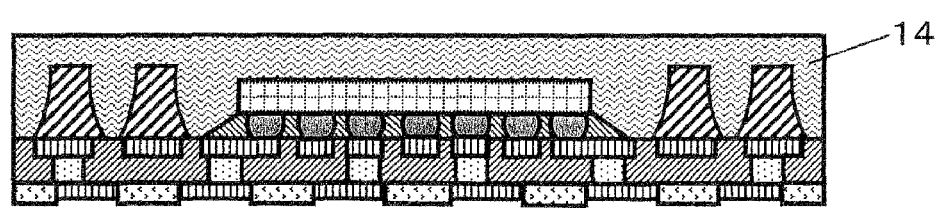
FIG. 13J is a sectional view showing an example of the construction of a semiconductor device for explaining the method of fabricating the semiconductor device according to the first exemplary embodiment of the present invention.

Next, as shown in FIG. 13J, semiconductor element 10 and metal posts 24 are sealed by sealing layer 14.

Any of glass, aramid, liquid crystal polymer, or PTFE is used as sealing layer 14. Alternatively, a material in which reinforcement material 27 composed of a plurality of glass, aramid, liquid crystal polymer, and PTFE is impregnated in or laminated with epoxy resin, epoxy acrylate resin, urethane acrylate resin, polyester resin, phenol resin, polyimide resin, BCB (benzocyclobutene), PBO (polybenzoxazole), or polynorbornane resin may also be used as sealing layer 14.

Sealing layer 14 is laminated by means of a method such as vacuum pressurization and vacuum lamination on metal posts 24 and semiconductor element 10 that is mounted.

When reinforcement material 27 is glass, a low-cost process can be realized. When reinforcement material 27 is aramid, high water-vapor permeability can be achieved. When reinforcement material 27 is a liquid crystal polymer, tensile strength and the modulus of elasticity are improved. When reinforcement material 27 is PTFE, heat resistance, shock resistance, and high insulation are improved.

Explanation next regards the method of laminating sealing layer 14.

Figure 14:
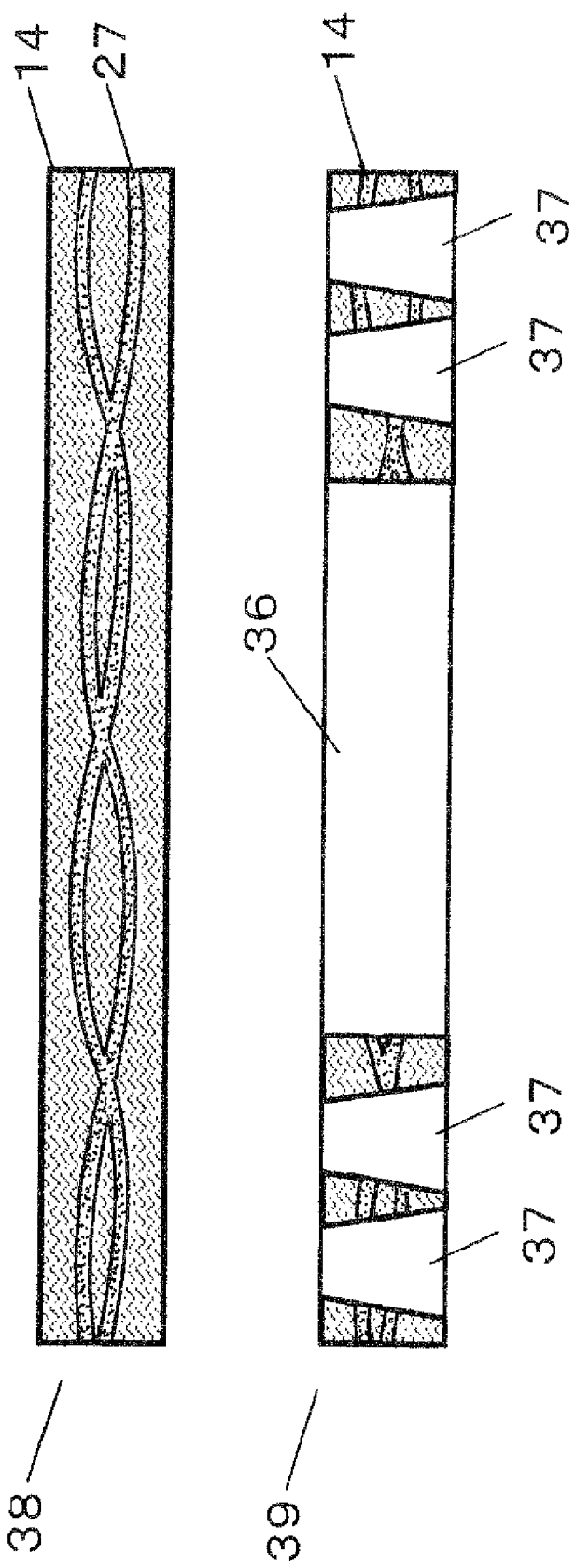
FIG. 14 is a sectional view showing an example of the construction of a semiconductor device for explaining the method of fabricating the semiconductor device according to the first exemplary embodiment of the present invention.

As shown in FIG. 14, semiconductor element area opening 36 and metal post area openings 37 are provided in advance on sealing layer 14. Methods such as a laser, drilling, dry etching, and wet etching may be used as the method of forming the openings. In the present embodiment, a laser is used.

Figure 15:
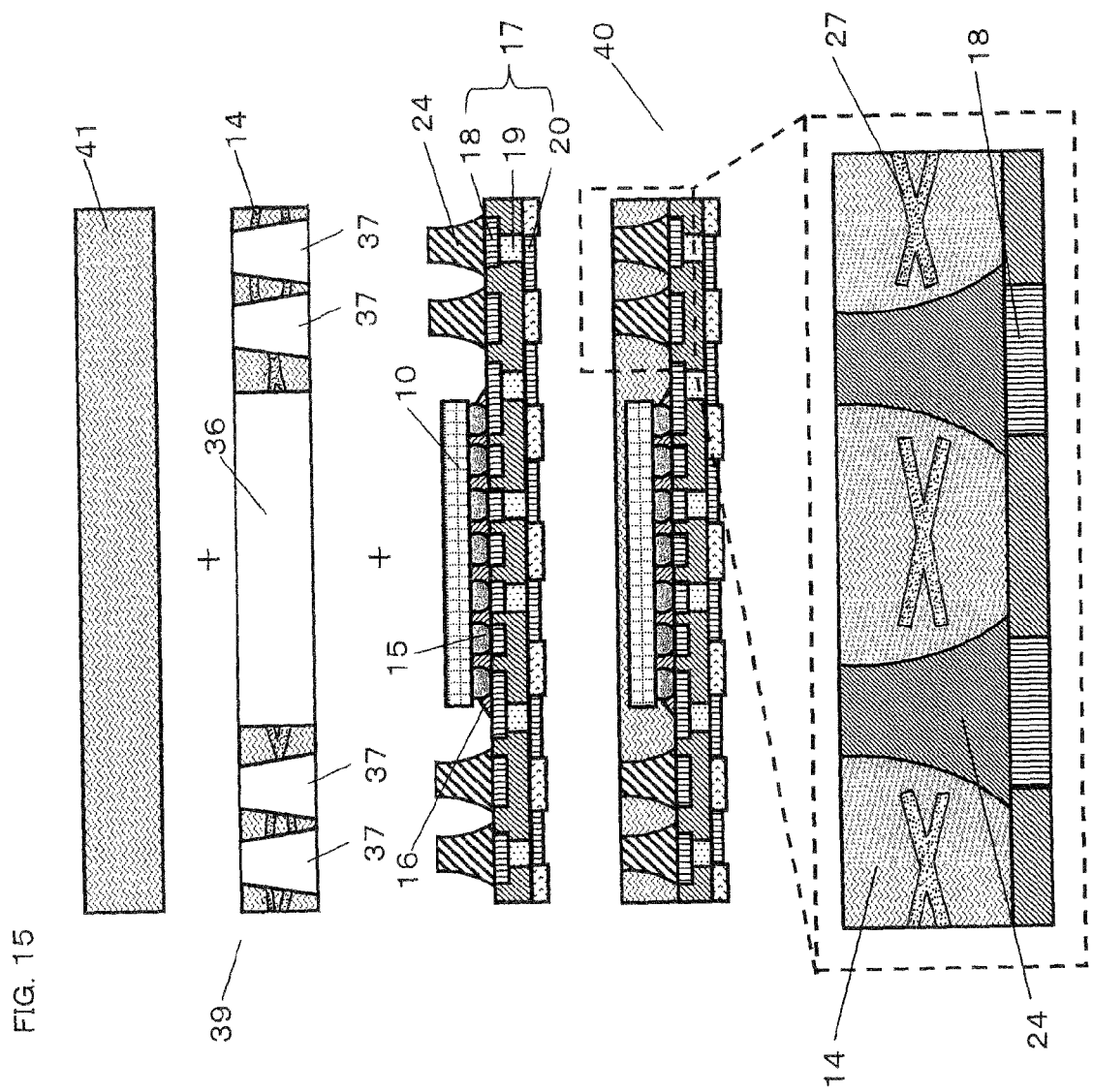
FIG. 15 is a sectional view showing an example of the construction of a semiconductor device for explaining the method of fabricating the semiconductor device according to the first exemplary embodiment of the present invention.

Next, as shown in FIG. 15, each of the substrates are stacked such that semiconductor element 10 and metal posts 24 on circuit board 17 are inserted into the semiconductor element area opening 36 and metal post area openings 37 on sealing layer 14. In addition, sealing layer 41 that lacks openings and reinforcement material is stacked on sealing layer 14. Sealing layer 41 that lacks openings and reinforcement material may also be stacked only on semiconductor element 10.

Next, reinforcement material 27 can effectively be provided around semiconductor element 10 and metal posts 24 by the batch curing these stacked resin components.

Figure 13K:
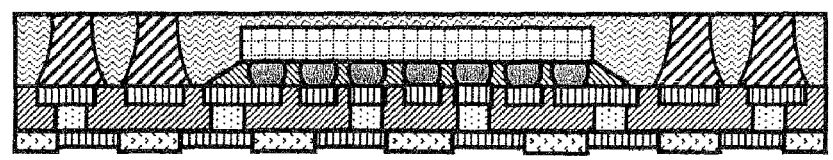
FIG. 13K is a sectional view showing an example of the construction of a semiconductor device for explaining the method of fabricating the semiconductor device according to the first exemplary embodiment of the present invention.

Next, as shown in FIG. 13K, the surfaces of metal posts 24 opposite the surfaces that contact circuit board 17 are exposed from the surface of sealing layer 14 by grinding or polishing and these surfaces are made substantially level with the surface of sealing layer 14.

Figure 13L:
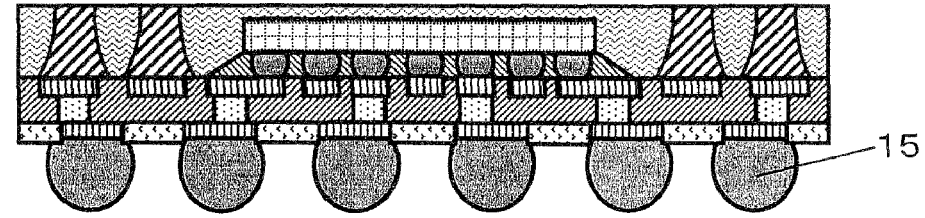
FIG. 13L is a sectional view showing an example of the construction of a semiconductor device for explaining the method of fabricating the semiconductor device according to the first exemplary embodiment of the present invention.

Next, as shown in FIG. 13L, solder balls 15 are mounted on the surface of circuit board 17 that is opposite metal posts 24.

According to the present embodiment, the semiconductor device of the first embodiment can be efficiently formed.

Semiconductor element 10 and metal posts 24 are secured by sealing layer 14 that includes reinforcement material 27, whereby the rigidity of semiconductor device 40 can be increased by sealing layer 14, and reduced warp of semiconductor device 40 is achieved.

In addition, sealing layer 14 can increase the rigidity of semiconductor device 40. As a result, circuit board 17 can be made thinner. Using a thin substrate as circuit board 17 enables the realization of semiconductor device 40 that has little warp and moreover, that is thin.

Figure 16A:
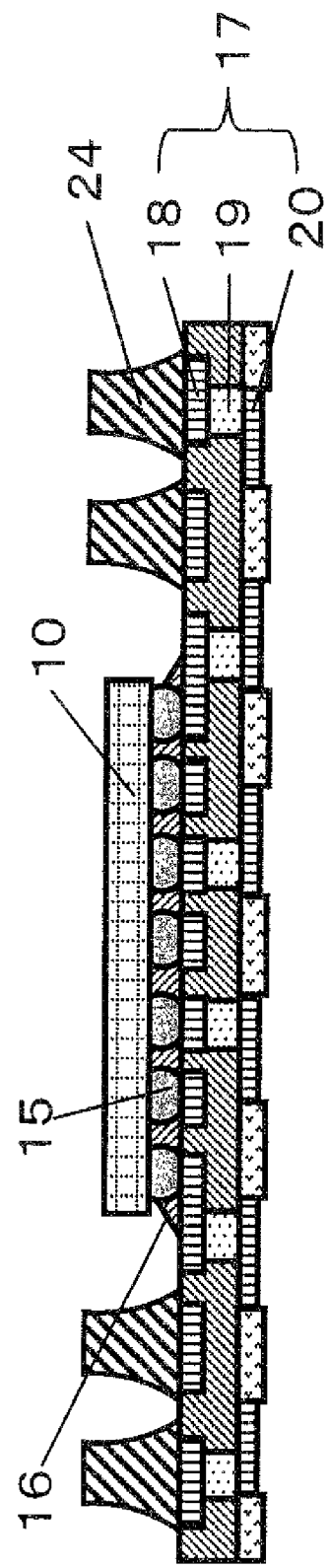
FIG. 16A is a sectional view showing an example of the construction of a semiconductor device for explaining the method of fabricating the semiconductor device according to the first exemplary embodiment of the present invention.
Figure 16B:
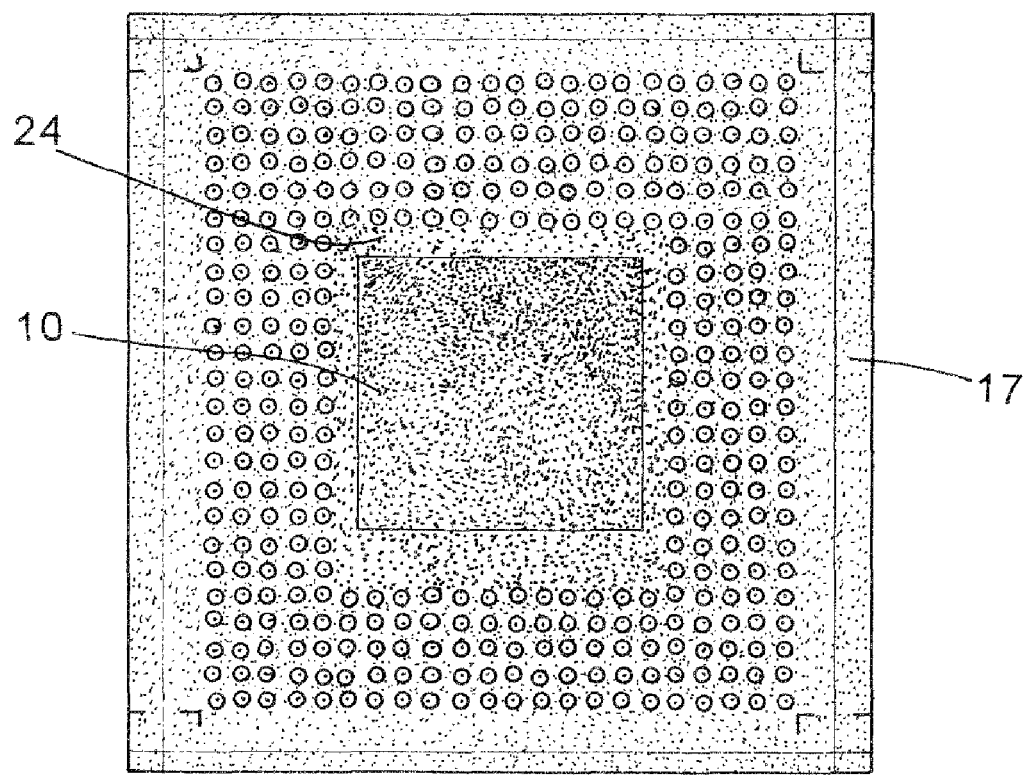
FIG. 16B is an upper plan view showing an example of the construction of a semiconductor device for explaining the method of fabricating the semiconductor device according to the first exemplary embodiment of the present invention.

FIG. 16A shows semiconductor element 10 and metal posts 24 that are provided on circuit board 17, and FIG. 16B is an upper plan view of this construction.

Figure 16C:
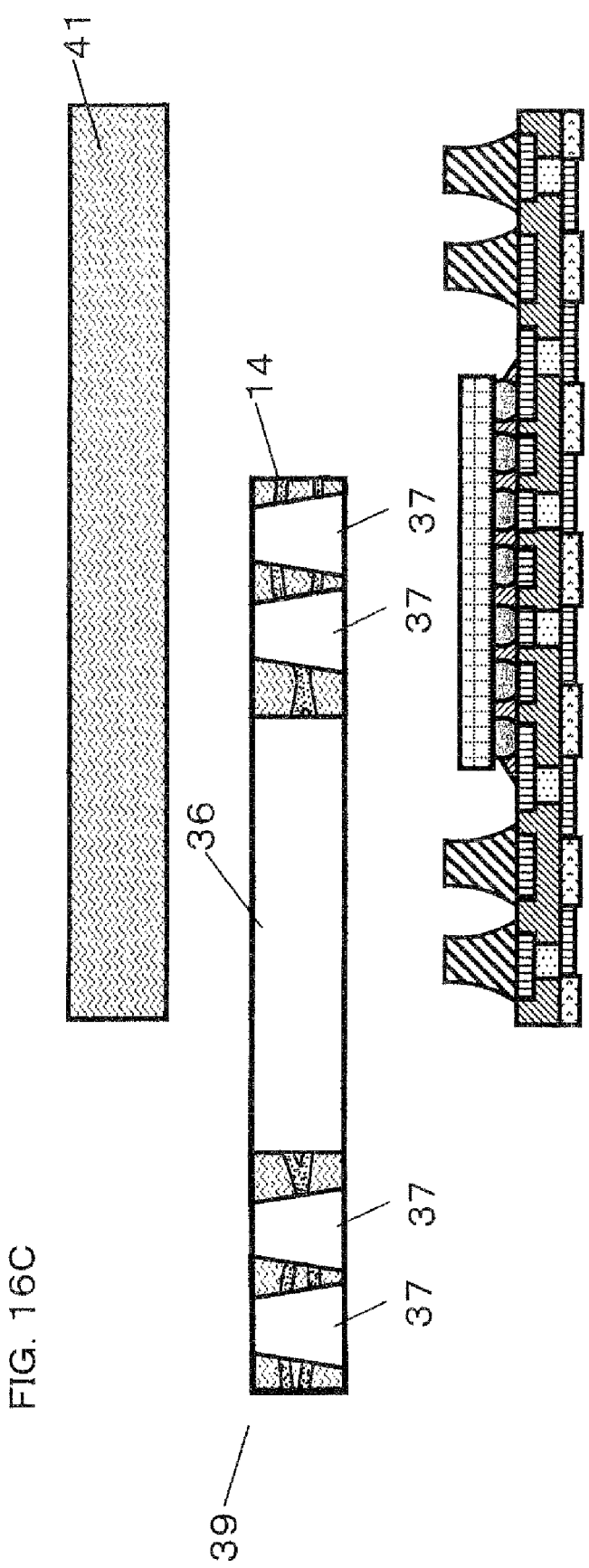
FIG. 16C is a sectional view showing an example of the construction of a semiconductor device for explaining the method of fabricating the semiconductor device according to the first exemplary embodiment of the present invention.
Figure 16D:
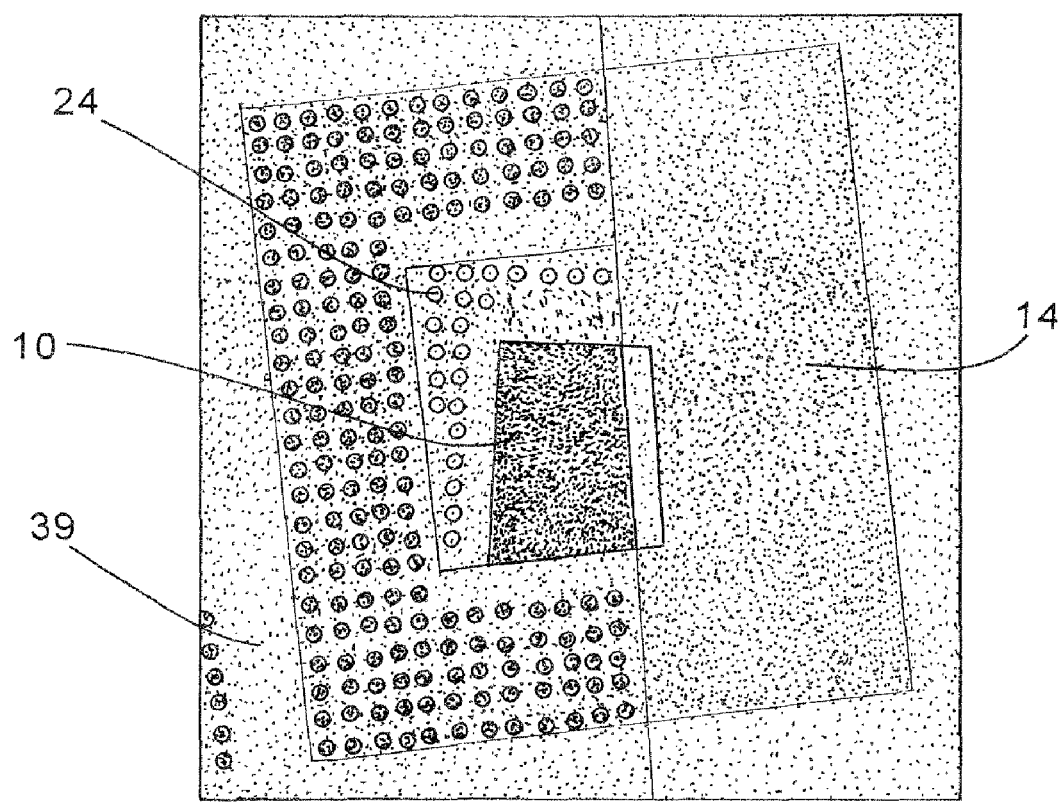
FIG. 16D is an upper plan view showing an example of the construction of a semiconductor device for explaining the method of fabricating the semiconductor device according to the first exemplary embodiment of the present invention.

FIG. 16C is a sectional view for explaining the state when superposing and stacking sealing layer 14 that includes reinforcement material 27 in which are provided semiconductor element area opening 36 and metal post area opening 37 and sealing layer 41 that lacks openings and reinforcement material and that is arranged over sealing layer 14 on circuit board 17 shown in FIG. 16A, and FIG. 16D is an upper plan view of this configuration.

Figure 16E:
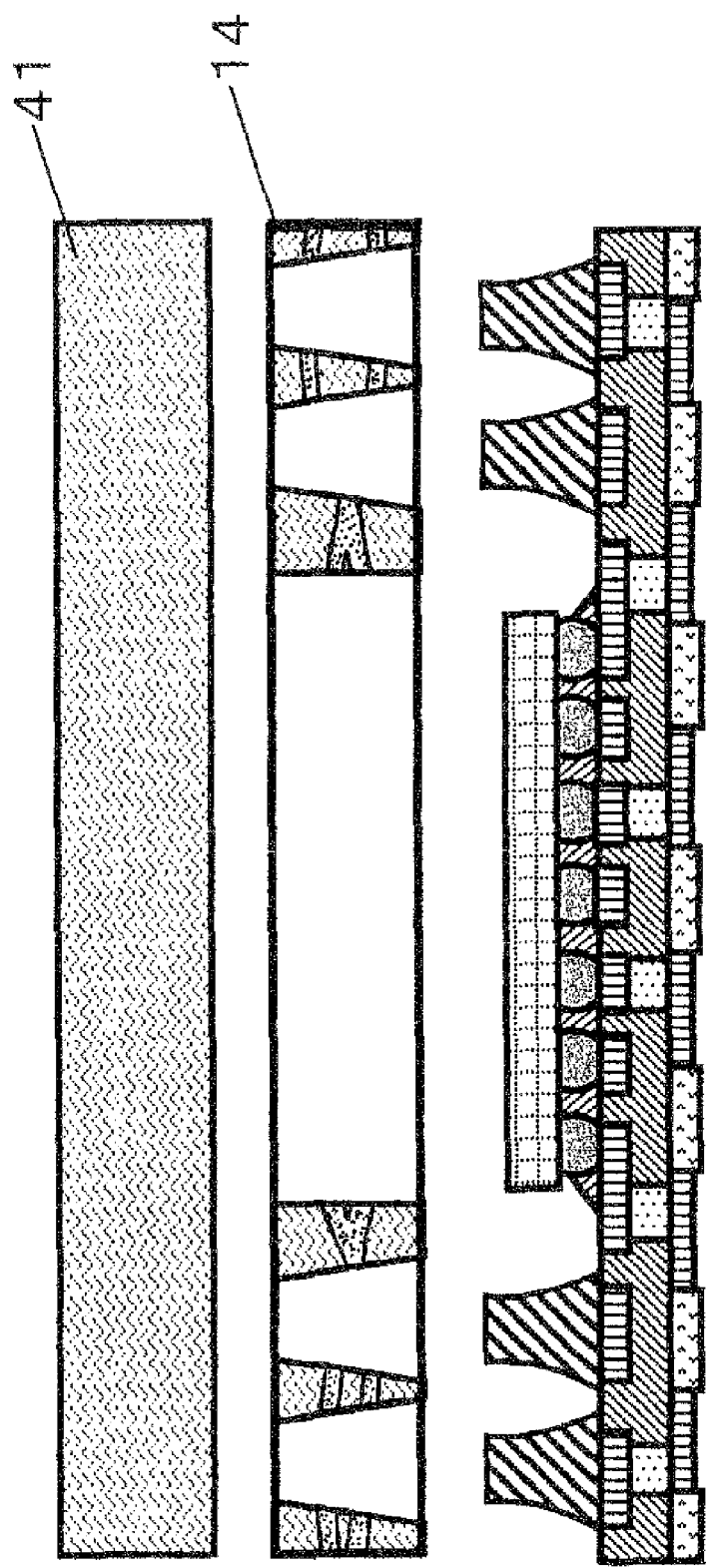
FIG. 16E is a sectional view showing an example of the construction of a semiconductor device for explaining the method of fabricating the semiconductor device according to the first exemplary embodiment of the present invention.
Figure 16F:
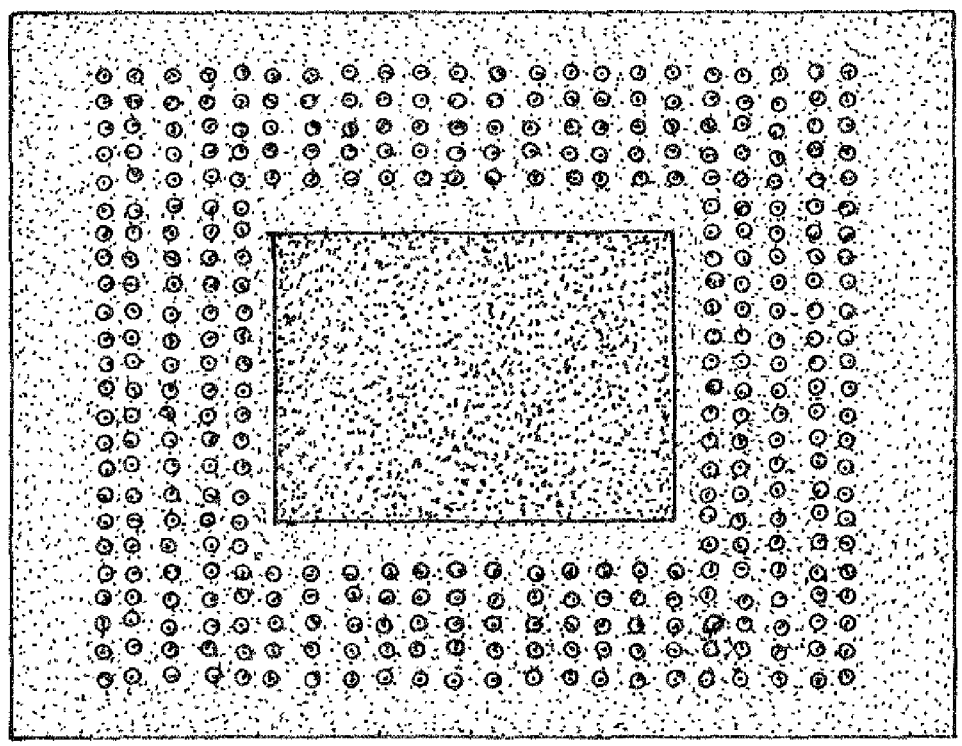
FIG. 16F is an upper plan view showing an example of the construction of a semiconductor device for explaining the method of fabricating the semiconductor device according to the first exemplary embodiment of the present invention.

FIG. 16E is a sectional view following stacking, and FIG. 16F is an upper plan view of this configuration.

Figure 17:
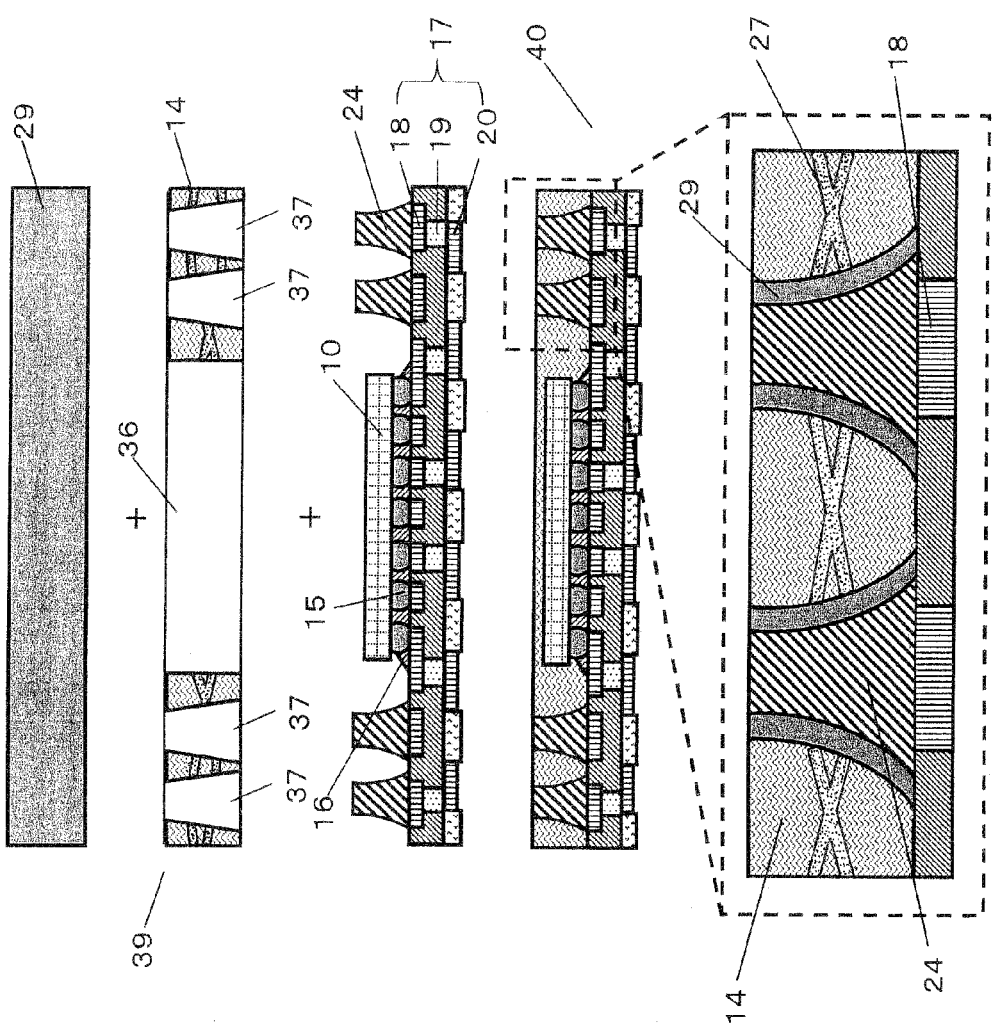
FIG. 17 is a sectional view showing an example of the construction of a semiconductor device for explaining the method of fabricating the semiconductor device according to the second exemplary embodiment of the present invention.
Figure 19A:
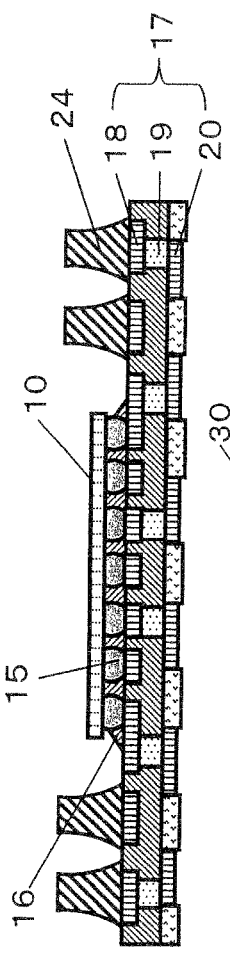
FIG. 19A is a sectional view showing an example of the construction of a semiconductor device for explaining a first modification of the method of fabricating the semiconductor device according to the third exemplary embodiment of the present invention.
Figure 19B:
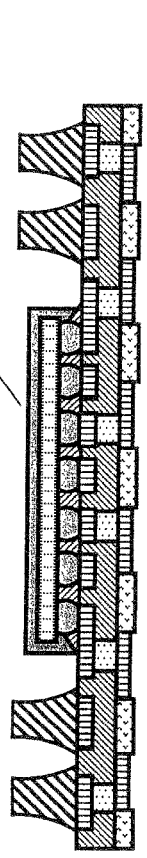
FIG. 19B is a sectional view showing an example of the construction of a semiconductor device for explaining a first modification of the method of fabricating the semiconductor device according to the third exemplary embodiment of the present invention.
Figure 19C:
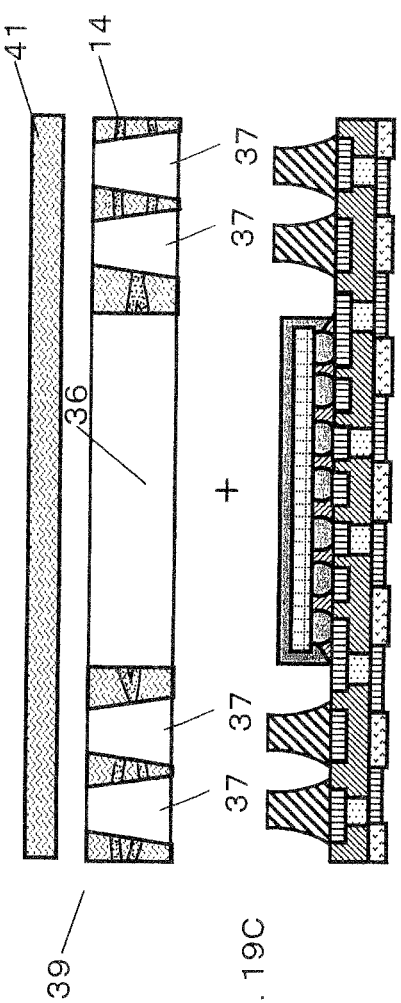
FIG. 19C is a sectional view showing an example of the construction of a semiconductor device for explaining a first modification of the method of fabricating the semiconductor device according to the third exemplary embodiment of the present invention.
Figure 19D:
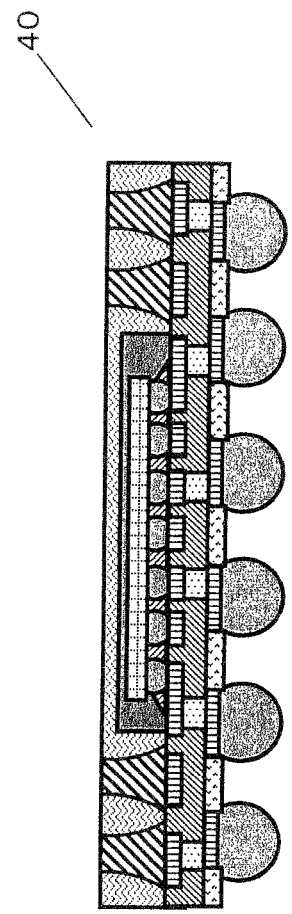
FIG. 19D is a sectional view showing an example of the construction of a semiconductor device for explaining a first modification of the method of fabricating the semiconductor device according to the third exemplary embodiment of the present invention.

FIG. 17 is a sectional view showing a portion of the method of fabricating the semiconductor device according to the second exemplary embodiment of the present invention. The fabrication method of the present embodiment is for fabricating the semiconductor device of the second embodiment such as shown in FIG. 6.

The following explanation regards portions that differ from the first exemplary embodiment of the method of fabricating a semiconductor device. Parts that are not specifically described are the same as in the explanation of the first exemplary embodiment of the method of fabricating a semiconductor device.

Explanation first regards the method of stacking sealing layer 14.

As shown in FIG. 17, semiconductor element area opening 36 and metal post area openings 37 are provided in sealing layer 14 in advance. The openings are formed using, for example, a laser, drill, dry etching, and wet etching. In the present embodiment, a laser is used.

Next, as shown in FIG. 17, each of the substrates are stacked such that semiconductor element 10 and metal posts 24 on circuit board 17 are inserted into semiconductor element area opening 36 and metal post area openings 37 on sealing layer 14. In addition, embedding material 29 that differs from sealing layer 14 and that lacks openings and reinforcement material is stacked on sealing layer 14.

Next, reinforcement material 27 can be effectively provided around semiconductor element 10 and metal posts 24 by the batch curing of these stacked resin parts, and embedding material 29 that differs from sealing layer 14 can be formed between semiconductor element 10 and metal posts 24, and reinforcement material 27.

According to the present embodiment, the semiconductor device of the second exemplary embodiment can be efficiently formed.

In addition, semiconductor element 10 and metal posts 24 are secured by sealing layer 14 that includes reinforcement material 27. As a result, the rigidity of semiconductor device 40 can be increased by sealing layer 14, and lower warp of semiconductor device 40 can be achieved. Still further, the increased rigidity of semiconductor device 40 enables the use of a thin substrate as circuit board 17. The use of a thin substrate enables the realization of a semiconductor device having less warp, and moreover, that is thin.

Still further, by making embedding material 29 provided between reinforcement material 27 and semiconductor element 10 or metal posts 24 a less elastic resin than sealing layer 14, these components function as a stress-relief layer, whereby the reliability of a semiconductor device as a single entity and the reliability in secondary packaging are improved.

In addition, by using embedding material 29, the outer peripheries of semiconductor element 10 and metal posts 24 can be secured by embedding material 29, and the remaining areas can be secured by sealing layer 14. By making each area a different resin, the optimum organic material for preventing warp can be selected in each area to enable a further suppression of warp of the semiconductor device.

FIG. 18 is a sectional view showing a portion of the method of fabricating the semiconductor device according to the third exemplary embodiment of the present invention. The fabrication method of this embodiment is for fabricating the semiconductor device according to the third exemplary embodiment such as shown in FIG. 7.

The following explanation regards the parts that differ from the first exemplary embodiment of the fabrication method of a semiconductor device. Parts that are not specifically described are the same as in the explanation of the first exemplary embodiment of the fabrication method of a semiconductor device.

As shown in FIG. 18A, semiconductor element 10 and metal posts 24 are provided on circuit board 17.

Next, as shown in FIG. 18B, semiconductor element sealing layer 30 is laminated only in the area of semiconductor element 10.

The material of semiconductor element sealing layer 30 is, for example, epoxy resin, epoxy acrylate resin, urethane acrylate resin, polyester resin, phenol resin, polyimide resin, BCB (benzocyclobutene), PBO (polybenzoxazole), or polynorbornane resin. Semiconductor element sealing layer 30 is provided using, for example, a transfer molding method, a compressed formation molding method, a printing method, a vacuum pressurization method, or vacuum lamination.

Next, as shown in FIG. 18C, sealing layer 14 is laminated only in the areas of metal posts 24.

Metal post area openings 37 are provided in advance in sealing layer 14. The openings are formed using, for example, a laser, drill, dry etching, or wet etching. In the present embodiment, a laser is used.

Each substrate is next stacked such that metal posts 24 on circuit board 17 are inserted in metal post area openings 37 on sealing layer 14. In addition, sealing layer 41 that lacks openings and reinforcement material may either be stacked or not stacked.

Alternatively, sealing layer 41 that lacks openings and reinforcement material may be stacked in the area of semiconductor element 10 as shown in FIGS. 19A-19D. In addition, embedding material 29 may also be stacked.

The embedding of semiconductor element sealing layer 30 and metal posts 24 may also be in the reverse order.

According to the present embodiment, the semiconductor device of the third exemplary embodiment is efficiently formed.

In addition, semiconductor element 10 and metal posts 24 are secured by sealing layer 14 that includes reinforcement material 27. As a result, the rigidity of semiconductor device 40 can be increased by sealing layer 14 and reduced warp of semiconductor device 40 can be achieved. In addition, the increase in the rigidity of semiconductor device 40 realized by sealing layer 14 allows the use of a thinner substrate as circuit board 17, whereby a semiconductor device having reduced warp and of thinner form can be achieved.

In addition, sealing metal posts 24 by sealing layer 14 and sealing semiconductor element 10 by semiconductor element sealing layer 30 allows selection of the optimum organic material for preventing warp in each of the areas, whereby a further suppression of warp of the semiconductor device can be achieved.

In addition, the height of semiconductor element sealing layer 30 and sealing layer 14 can be freely adjusted. When semiconductor element sealing layer 30 projects above sealing layer 14, semiconductor element 10 can be made thicker. Increasing the thickness of the resin of semiconductor element sealing layer 30 on semiconductor element 10 enables a reduction of warp on semiconductor element 10. On the other hand, when semiconductor element sealing layer 30 is depressed below sealing layer 14, semiconductor element 10 can be made thin and the assembly height when connected with another semiconductor device can be made lower.

FIG. 20 is a sectional view showing a portion of the method of fabricating the semiconductor device according to the fourth exemplary embodiment of the present invention. The fabrication method of this embodiment is for fabricating the semiconductor device according to the fourth exemplary embodiment such as shown in FIG. 11.

The following explanation regards the parts that differ from the first exemplary embodiment of the fabrication method of a semiconductor device. Parts that are not specifically descried are the same as in the explanation of the first exemplary embodiment of the fabrication method of a semiconductor device.

In the fabrication method of a semiconductor device of the present embodiment, the semiconductor device according to the first to third exemplary embodiments is connected to another semiconductor device by way of metal posts 24 as shown in FIGS. 20A-20B.

Any of the semiconductor devices of the first to third exemplary embodiments may be used as the semiconductor device shown in FIG. 20. Solder balls 15 are provided on the upper semiconductor device at points that correspond to the exposed surfaces of metal posts 24 of the lower semiconductor device.

The upper semiconductor device is first stacked on the upper layer of the lower semiconductor device using mounting equipment. Alternatively, the lower semiconductor device may be packaged on a board and the upper semiconductor device then mounted.

Metal posts 24 of the lower semiconductor device function as external terminals. The function as external terminals should include at least the function of electrically connecting to an external element. At least one of metal posts 24 is connected to lower-layer wiring 18.

Next, while maintaining this state, the assembly is introduced into a reflow furnace to apply a temperature of at least the melting point of solder balls 15, whereby solder balls 15 are connected to metal posts 24. A method may also be employed in which, instead of reflow, solder balls 15 are melted by the mounting equipment.

According to the present embodiment, the semiconductor device of the fourth exemplary embodiment is efficiently formed.

In addition, semiconductor element 10 and metal posts 24 are secured by sealing layer 14 that includes reinforcement material 27. The rigidity of semiconductor device 40 can therefore be increased by sealing layer 14 and semiconductor device 40 having reduced warp is achieved. In addition, the increase in rigidity of semiconductor device 40 realized by sealing layer 14 enables the use of a thin substrate as circuit board 17. The use of a thin substrate enables the realization of a semiconductor device that has reduced warp, and moreover, a thin form.

The present embodiment has various advantages such as enabling stacking of multiple layers of semiconductor devices, increasing the degree of freedom of combination of semiconductor elements, and raising the flexibility of processing for changes in memory capacity. In addition, a high heat-discharge semiconductor device can be realized by mounting a heat sink.

Each of the exemplary embodiments exhibits the following effects:

Sealant covers not only the site of mounting semiconductor element 10 but also the entire surface of circuit board 17 on which semiconductor element 10 is mounted. In this case, not only can the rigidity of the semiconductor device be maintained, but lower warp can also be realized.

In addition, when sealing layer 14 includes reinforcement material 27, the overall rigidity of the semiconductor device is further improved, the unit reliability of a package is improved, and because the difference in thermal expansion of the package substrate (circuit board) 17 and semiconductor element 10 is decreased, the package reliability is also improved.

Further, because the rigidity of the semiconductor device is increased, high connection reliability with upper packages can be achieved when packages are stacked above the semiconductor device.

In addition, metal posts 24 provided in the semiconductor device can function not only as connection terminals, but also as a heat discharge path, whereby a high-heat discharge semiconductor device can be realized.

Still further, the increased rigidity of the semiconductor device brought about by sealing layer 14 allows a corresponding thinning of circuit board 17. The use of a thin substrate as circuit board 17 allows the realization of a semiconductor device that both has low warp and is thin in form.

The method of fabricating the above-described semiconductor device uses a metal body, which is the support base of the thin substrate, as connection terminals. As a result, the need to newly form electrodes is eliminated, whereby lower cost can be achieved for a semiconductor device than for the stacked package SiP construction of the related art.

In addition, sealing layer 14 that includes reinforcement material 27 can be provided effectively at the peripheries of semiconductor element 10 and metal posts 24.

In order to improve the handling ability of circuit board on which metal posts 24 are formed, part of the metal body that is the support base is left. The rigidity of circuit board 17 on which metal posts 24 are formed can therefore be maintained.

The sealing layer is preferably an organic material that includes reinforcement material.

The reinforcement material is preferably composed of any of glass, aramid, liquid crystal polymer, and PTFE, or composed of a plurality of these materials.

The reinforcement material is preferably a woven fabric.

The reinforcement material is preferably a non-woven fabric.

The reinforcement material is preferably a film.

The reinforcement material and the metal posts preferably do not contact.

The reinforcement material and metal posts preferably contact.

An embedding material is preferably provided at the periphery of the metal posts.

The sealing layer preferably includes a semiconductor element sealing layer that covers the semiconductor element.

Regarding the shape of the metal posts, the area of the surfaces of the metal posts that contact the circuit board is preferably greater than the area of the opposite surfaces of the metal posts.

A portion of the wiring layer of the circuit board of the surface on which the metal posts are provided is preferably lower than the insulating layer.

The connection between the semiconductor element and circuit board is preferably either flip-chip connection or wire bonding connection.

The connection between the semiconductor element and circuit board is preferably connection in which circuit board wiring is directly connected to connection terminal parts of the semiconductor element.

There is preferably a plurality of metal posts, any of the metal posts being preferably connected to a wiring layer and used as the connection parts with another semiconductor device.

The metal posts are preferably connected to a heat sink.

The embedding a semiconductor element and metal posts preferably includes: forming a semiconductor element area opening and metal post area openings in a sealing layer; stacking the sealing layer in which openings have been formed on a circuit board on which the semiconductor element and metal posts have been provided; and stacking a second sealing layer that lacks openings and reinforcement material on the sealing layer.

The embedding a semiconductor element and metal posts preferably includes: forming a semiconductor element area opening and metal post area openings in a sealing layer; stacking the sealing layer in which openings have been formed on a circuit board on which the semiconductor element and metal posts have been provided; and stacking an embedding material on the sealing layer.

The embedding a semiconductor element and metal posts preferably includes: embedding the semiconductor element in a semiconductor element sealing layer; and embedding the metal posts in a sealing layer.

The embedding the semiconductor element and metal posts preferably includes: embedding the metal posts in a sealing layer; and embedding the semiconductor element in a semiconductor element sealing layer.

Stacking a semiconductor device with the metal posts of the semiconductor device as electrical connection parts is preferably included.

An exemplary advantage according to the invention is the capability of providing both a semiconductor device that can simultaneously realize an assembly height having a lower profile and reduced package warp and a method of fabricating such a semiconductor device.

While an exemplary embodiment of the present invention has been described using specific terms, such description is for illustrative purposes only, and it is to be understood that changes and variations may be made without departing from the spirit or scope of the following claims.

What is claimed is:

1. A semiconductor device wherein a semiconductor element is mounted on one side of a circuit board that is made up from an insulating layer and a wiring layer, said semiconductor device comprising:
   metal posts provided on the side of said circuit board on which said semiconductor element is mounted; and
   a sealing layer provided on the side of said circuit board on which said semiconductor element is mounted such that said semiconductor element is covered and such that only portions of said metal posts are exposed,
   wherein said sealing layer is an organic material that includes a reinforcement material, and said reinforcement material and the side of said metal posts do not contact.

2. The semiconductor device according to claim 1, wherein said reinforcement material is composed of any of glass, aramid, liquid crystal polymer, and PTFE, or composed of a plurality of these materials.

3. The semiconductor device according to claim 1, wherein said reinforcement material is a woven fabric.

4. The semiconductor device according to claim 1, wherein said reinforcement material is a non-woven fabric.

5. The semiconductor device according to claim 1, wherein said reinforcement material is a film.

6. The semiconductor device according to claim 1, wherein said reinforcement material and said metal posts contact.

7. The semiconductor device according to claim 1, wherein an embedding material is provided around said metal posts.

8. The semiconductor device according to claim 1, wherein said sealing layer includes a semiconductor element sealing layer for covering said semiconductor element.

9. The semiconductor device according to claim 1, wherein, regarding shape of said metal posts, area of surfaces of said metal posts that contact said circuit board is greater than area of the opposite surfaces of said metal posts, and each of said metal posts is formed as a unit.

10. The semiconductor device according to claim 1, wherein a portion of said wiring layer of said circuit board on the side on which said metal posts are provided is lower than said insulating layer.

11. The semiconductor device according to claim 1, wherein connection between said semiconductor element and said circuit board is one of flip-chip connection and wire bonding connection.

12. The semiconductor device according to claim 1, wherein connection between said semiconductor element and said circuit board is connection in which wiring of said circuit board is directly connected to a connection terminal part of said semiconductor element.

13. The semiconductor device according to claim 1, wherein there is a plurality of said metal posts, and any of said metal posts is connected to said wiring layer and used as connect parts with another semiconductor device.

14. The semiconductor device according to claim 1, wherein said metal posts are connected to a heat sink.

* * * * *